(12) United States Patent
Consoli et al.

(10) Patent No.: US 10,381,762 B2
(45) Date of Patent: Aug. 13, 2019

(54) ELECTRICAL CONNECTOR FOR A CIRCUIT CARD ASSEMBLY OF A COMMUNICATION SYSTEM

(71) Applicant: TE CONNECTIVITY CORPORATION, Berwyn, PA (US)

(72) Inventors: John Joseph Consoli, Harrisburg, PA (US); Chad William Morgan, Carneys Point, NJ (US); Matthew Jeffrey Sypolt, Harrisburg, PA (US)

(73) Assignee: TE CONNECTIVITY CORPORATION, Berwyn, PA (US)

( * ) Notice: Subject to any disclaimer, the term of this patent is extended or adjusted under 35 U.S.C. 154(b) by 0 days.

(21) Appl. No.: 15/945,775

(22) Filed: Apr. 5, 2018

(65) Prior Publication Data
US 2019/0103692 A1    Apr. 4, 2019

Related U.S. Application Data

(60) Provisional application No. 62/565,296, filed on Sep. 29, 2017.

(51) Int. Cl.
*H01R 12/73* (2011.01)
*H01R 13/6582* (2011.01)
(Continued)

(52) U.S. Cl.
CPC ........... *H01R 12/737* (2013.01); *H01R 13/40* (2013.01); *H01R 13/502* (2013.01);
(Continued)

(58) Field of Classification Search
CPC .... H01R 12/737; H01R 13/40; H01R 13/502; H01R 13/562; H01R 13/631; H01R 13/6477; H01R 13/6582; H01R 13/6585
(Continued)

(56) References Cited

U.S. PATENT DOCUMENTS 3,587,029 A  *  6/1971  Knowles ............ H01R 13/6471
                                                        439/108
4,560,221 A     12/1985  Olsson
(Continued)

FOREIGN PATENT DOCUMENTS

EP      2346117 A2    7/2011
EP      2451262 A2    5/2012
(Continued)

OTHER PUBLICATIONS

Kerridge et al., 'Fast Backplane Connectors Disguise Digital Transmission Lines,' (Texas Instrument), Reed Business Information, Highlands Ranch, Co, US, vol. 42, No. Europe, May 8, 1997, XP000724062.
(Continued)

*Primary Examiner* — Harshad C Patel

(57) ABSTRACT

An electrical connector for a circuit card assembly including a PCB includes a mating housing having a mating end movable relative to the PCB and contact modules coupled to the mating housing including signal contacts having a mating conductor, a mounting conductor and a flexible conductor. The flexible conductor is flexible to allow relative movement of the mating conductor relative to the mounting conductor. The flexible conductor has a bent portion changing shape. The contact modules have ground contacts providing electrical shielding for the signal contacts. The ground contacts include covers extending along and providing shielding along at least one side of the bent portion of the corresponding signal contact.

20 Claims, 15 Drawing Sheets

(51) Int. Cl.
*H01R 13/6585* (2011.01)
*H01R 13/6477* (2011.01)
*H05K 1/14* (2006.01)
*H01R 13/631* (2006.01)
*H01R 13/502* (2006.01)
*H01R 13/56* (2006.01)
*H05K 7/14* (2006.01)
*H01R 13/40* (2006.01)

(52) U.S. Cl.
CPC ......... *H01R 13/562* (2013.01); *H01R 13/631* (2013.01); *H01R 13/6477* (2013.01); *H01R 13/6582* (2013.01); *H01R 13/6585* (2013.01); *H05K 1/14* (2013.01); *H05K 7/1417* (2013.01); *H05K 2201/048* (2013.01); *H05K 2201/09063* (2013.01); *H05K 2201/10325* (2013.01)

(58) Field of Classification Search
USPC .................. 439/66, 65, 79, 74, 75, 640, 713
See application file for complete search history.

(56) References Cited

U.S. PATENT DOCUMENTS

| | | | |
|---|---|---|---|
| 5,114,353 A | 5/1992 | Sample | |
| 5,676,559 A | 10/1997 | Laub et al. | |
| 6,796,822 B2 | 9/2004 | Sato et al. | |
| 6,918,775 B2 | 7/2005 | Korsunsky et al. | |
| 7,086,866 B1 * | 8/2006 | Folan | H01R 12/716 439/108 |
| 7,322,834 B2 * | 1/2008 | Hu | H01R 13/2428 439/700 |
| 7,326,092 B2 * | 2/2008 | Fedder | H01R 12/716 361/756 |
| 7,435,095 B1 | 10/2008 | Yi | |
| 7,540,744 B1 * | 6/2009 | Minich | H01R 12/585 439/65 |
| 7,708,578 B1 * | 5/2010 | Lenox | H01R 13/6315 439/248 |
| 7,771,207 B2 | 8/2010 | Hamner et al. | |
| 7,789,668 B1 | 9/2010 | Hamner et al. | |
| 7,824,187 B1 | 11/2010 | Yi | |
| 7,918,683 B1 | 4/2011 | Hamner et al. | |
| 7,988,457 B1 * | 8/2011 | Morgan | H01R 12/724 439/65 |
| 8,113,851 B2 | 2/2012 | Hamner et al. | |
| 8,199,511 B2 | 6/2012 | Kim et al. | |
| 8,376,766 B1 * | 2/2013 | Huettner | H01R 12/91 439/248 |
| 8,512,081 B2 * | 8/2013 | Stokoe | H01R 13/62 439/660 |
| 8,684,610 B2 | 4/2014 | Nichols et al. | |
| 9,551,625 B2 * | 1/2017 | Brugger | G01L 9/0041 |
| 9,608,371 B2 * | 3/2017 | Bonzom | F01N 3/2066 |
| 9,608,382 B2 | 3/2017 | McClellan et al. | |
| 9,917,406 B1 | 3/2018 | Iwasaki et al. | |
| 2002/0071259 A1 | 6/2002 | Roos | |
| 2005/0064733 A1 | 3/2005 | Korsunsky et al. | |
| 2005/0070136 A1 | 3/2005 | Korsunsky et al. | |
| 2005/0181637 A1 | 8/2005 | Williams et al. | |
| 2007/0184676 A1 | 8/2007 | Minich | |
| 2008/0045087 A1 | 2/2008 | Yi et al. | |
| 2014/0065849 A1 | 3/2014 | Kida et al. | |
| 2016/0006150 A1 | 1/2016 | Bachmutsky et al. | |
| 2018/0040989 A1 | 2/2018 | Chen | |
| 2018/0261941 A1 | 9/2018 | Consoli et al. | |

FOREIGN PATENT DOCUMENTS

| | | |
|---|---|---|
| JP | 2003044794 A | 2/2003 |
| TW | M537321 U | 2/2017 |
| WO | 2007092113 A2 | 8/2007 |

OTHER PUBLICATIONS

Co-pending application U.S. Appl. No. 15/945,821 filed Apr. 5, 2018.
Co-pending application U.S. Appl. No. 15/945,802 filed Apr. 5, 2018.
Co-pending application U.S. Appl. No. 15/945,787 filed Apr. 5, 2018.
Co-pending application U.S. Appl. No. 15/945,767 filed Apr. 5, 2018.
Co-pending application U.S. Appl. No. 15/945,812 filed Apr. 5, 2018.

* cited by examiner

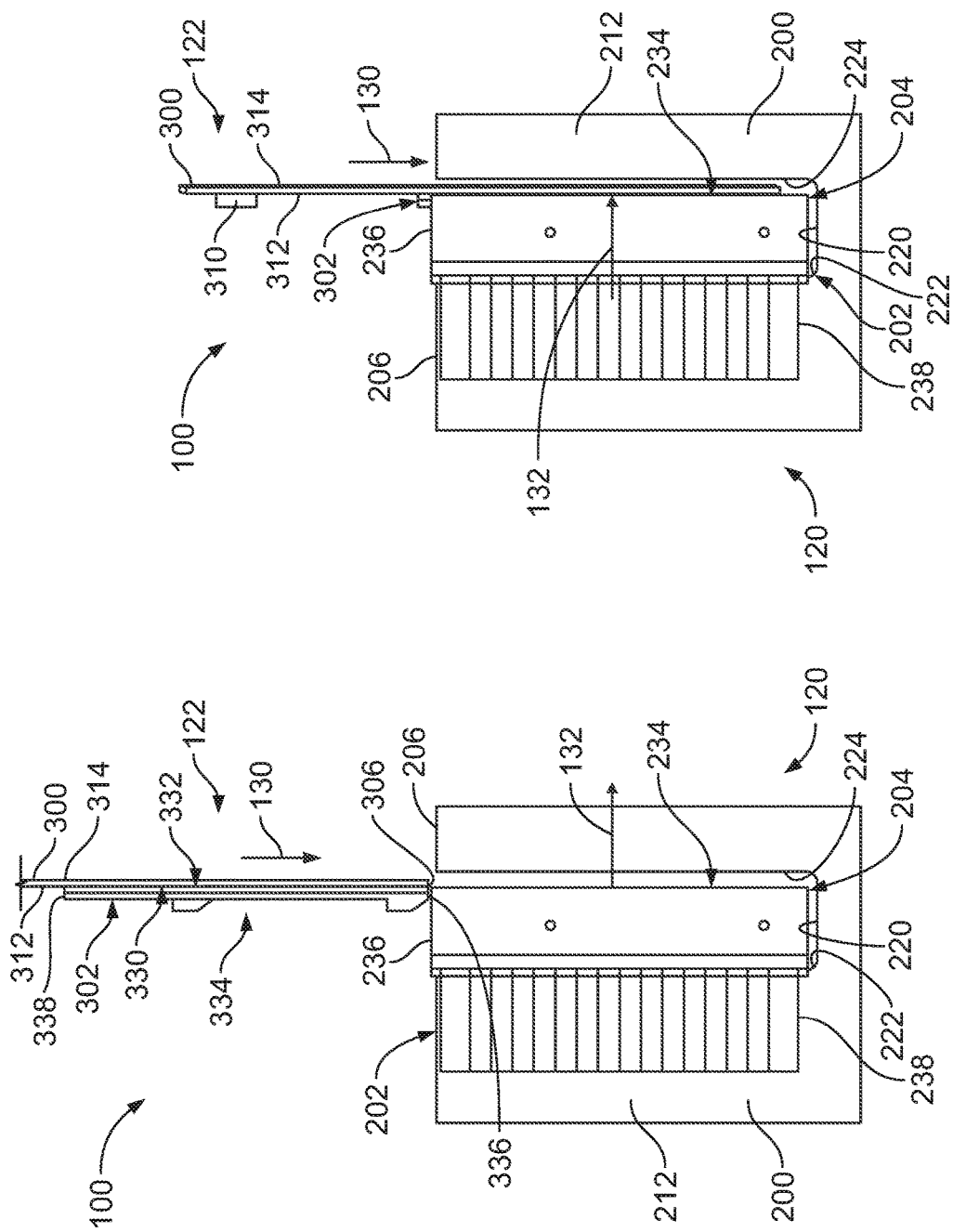

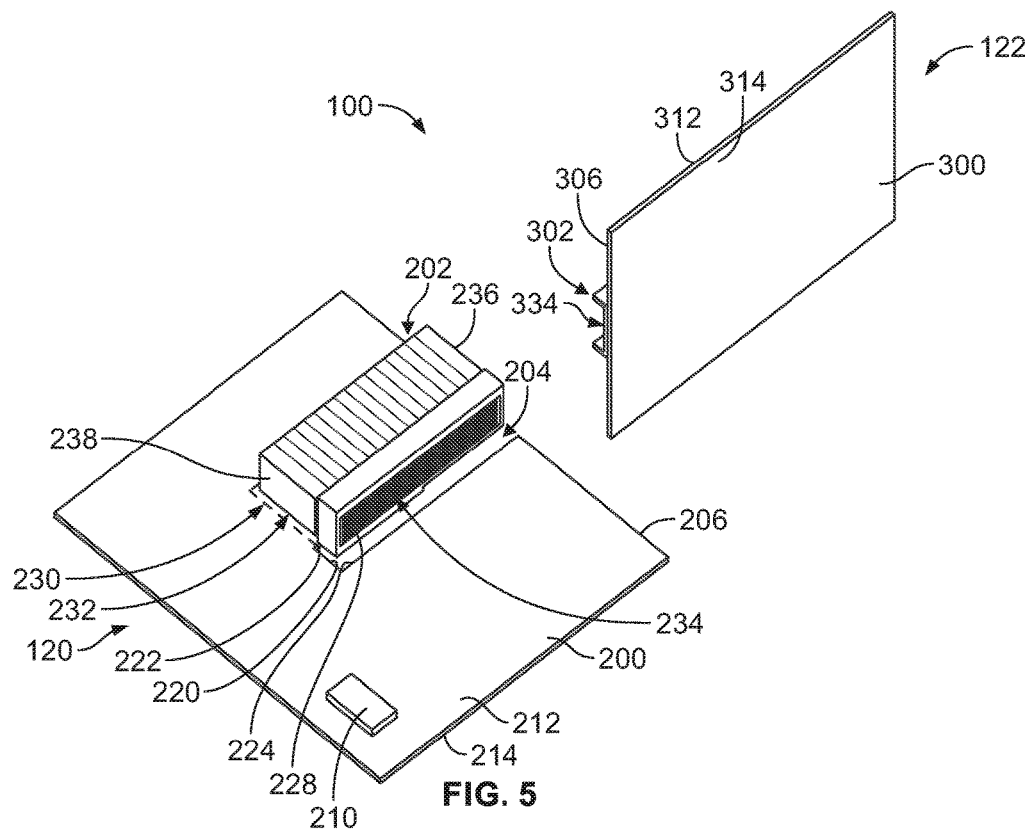
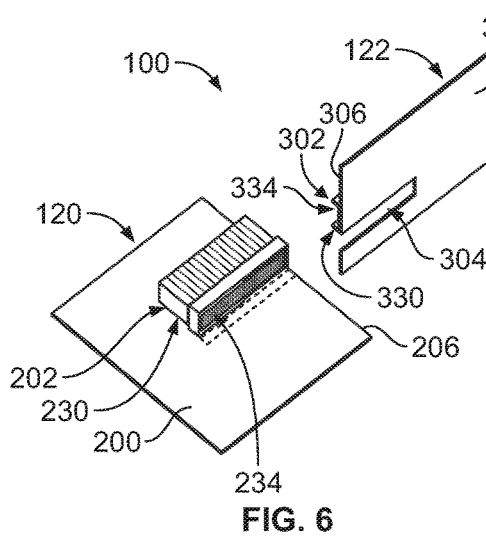
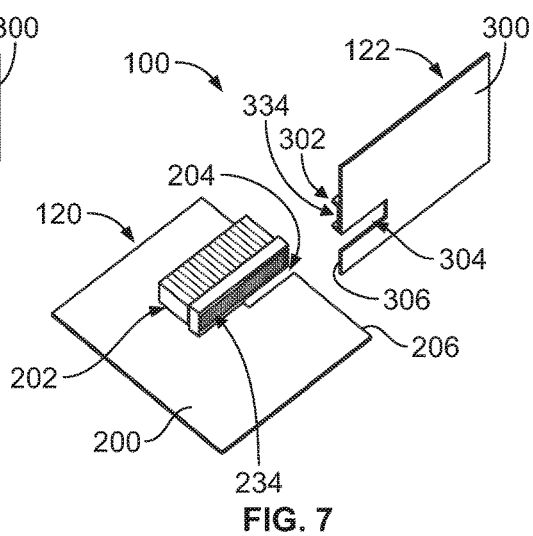

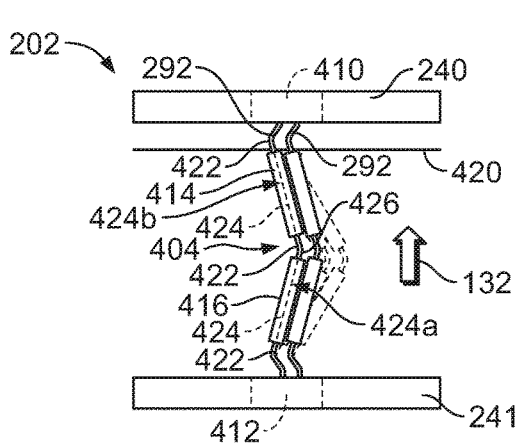 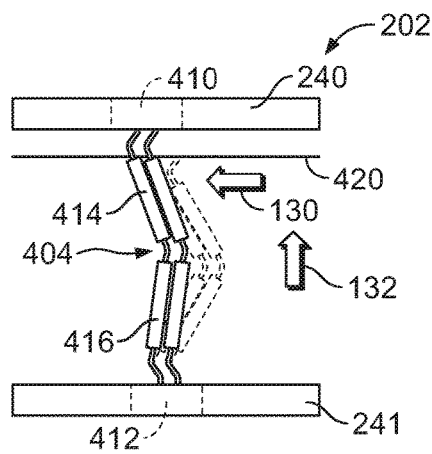
FIG. 15   FIG. 16
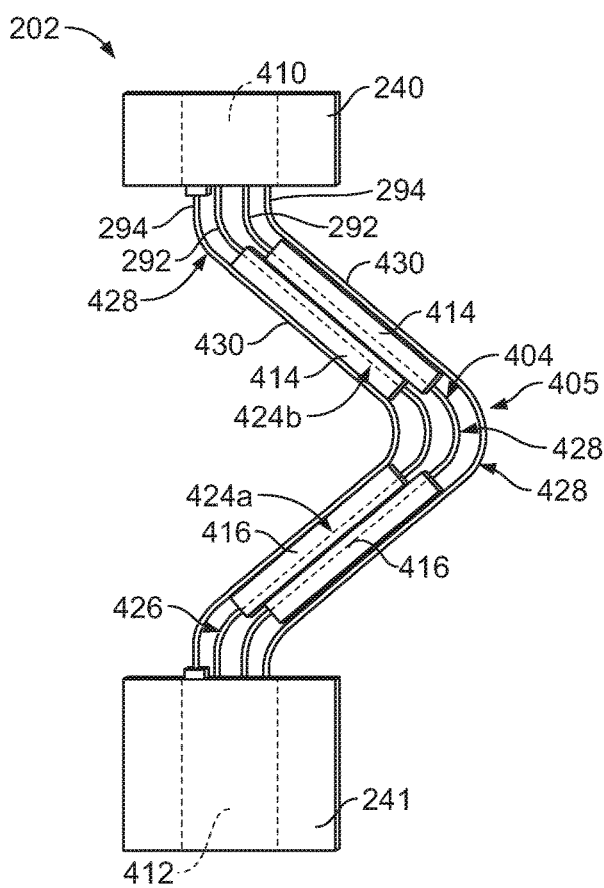 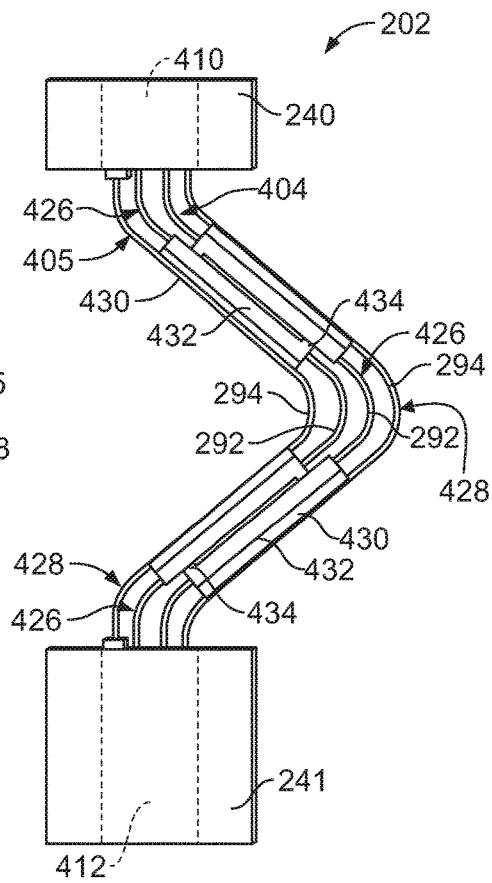
FIG. 17   FIG. 18

ELECTRICAL CONNECTOR FOR A CIRCUIT CARD ASSEMBLY OF A COMMUNICATION SYSTEM

CROSS REFERENCE TO RELATED APPLICATIONS

This application claims benefit to U.S. Provisional Application No. 62/565,296, filed Sep. 29, 2017, titled "ELECTRICAL CONNECTOR FOR A CIRCUIT CARD ASSEMBLY OF A COMMUNICATION SYSTEM", the subject matter of which is herein incorporated by reference in its entirety.

BACKGROUND OF THE INVENTION

The subject matter herein relates generally to circuit card assemblies for communication systems.

Communication systems are in use in various applications, such as network switches. The communication systems include various circuit cards, such as backplanes and/or daughtercards, which are coupled together to electrically connect various circuits. For example, the circuit cards include electrical connectors that are mated to electrical connectors of one or more other circuit cards. Some communication systems use a backplane or midplane that is perpendicular to the mating direction of the daughtercards. However, such backplanes or midplanes block airflow through the communication system leading to overheating of components or limiting operating speeds to avoid overheating.

Other communication systems arrange both circuit cards parallel to the mating direction to allow airflow through the system. The circuit cards are typically oriented perpendicular to each other (for example, horizontally and vertically). The electrical connectors are provided at edges of both circuit cards and direct mate to each other. Conventional communication systems utilize right angle electrical connectors on both cards that direct mate with each other in an orthogonal orientation. The mating interfaces of the electrical connectors are parallel to the mating edges of the circuit cards such that the electrical connectors are mated in a direction parallel to the mating direction of the circuit cards. However, such right angle electrical connectors are expensive to manufacture and occupy a large amount of space in the system, thus blocking airflow through the system.

A need remains for a cost effective and reliable communication system allowing airflow through the communication system for cooling the electrical components.

BRIEF DESCRIPTION OF THE INVENTION

In one embodiment, an electrical connector is provided for a circuit card assembly including a printed circuit board (PCB) including a mating housing having a mating end configured to be mated with a second electrical connector of a second circuit card assembly. The mating housing is movable relative to the PCB between a resting position and an extended position for mating with the second electrical connector. Contact modules are coupled to the mating housing. At least one of the contact modules includes signal contacts having a mating conductor, a mounting conductor and a flexible conductor between the mating conductor and the mounting conductor. The mounting conductor is terminated to the PCB. The mating conductor is held by and movable with the mating housing relative to the mounting conductor and the PCB. The flexible conductor is flexible to allow relative movement of the mating conductor relative to the mounting conductor. The flexible conductor has a bent portion changing shape when the flexible conductor is flexed. The contact modules include ground contacts extending along corresponding signal contacts and providing electrical shielding for the signal contacts. The ground contacts include covers extending along and providing shielding along at least one side of the bent portion of the corresponding signal contact.

In a further embodiment, an electrical connector is provided for a circuit card assembly including a printed circuit board (PCB) including a receptacle housing configured to be mounted to a mounting area of the PCB having a first side and a second side including a cavity between the first and second sides and a mating housing received in the cavity of the receptacle housing being movable relative to the receptacle housing in a connector mating direction and having a mating end configured to be mated with a second electrical connector of a second circuit card assembly. Contact modules are coupled to the receptacle housing and the mating housing and include a leadframe having signal contacts having a mating conductor, a mounting conductor and a flexible conductor between the mating conductor and the mounting conductor. The contact module includes an inner dielectric body holding the mating conductors in the mating housing and an outer dielectric body separate and discrete from the inner dielectric body holding the mounting conductors in the receptacle housing. The flexible conductors extend between the inner dielectric body and the outer dielectric body and are flexible therebetween to allow relative movement of the inner dielectric body and the mating housing in the connector mating direction relative to the outer dielectric body and the receptacle housing. The flexible conductor has a bent portion changing shape when the flexible conductor is flexed. The contact modules include ground contacts extending along the signal contacts and providing electrical shielding for the signal contacts. The ground contacts include covers extending along and providing shielding along at least one side of the bent portion of the corresponding signal contact.

In a further embodiment, a communication system is provided including a first circuit card assembly and a second circuit card assembly. The first circuit card assembly includes a first printed circuit board (PCB) and a first electrical connector mounted to the first PCB. The first electrical connector has a first mating end and first contacts at the first mating end having a mating conductor, a mounting conductor and a flexible conductor between the mating conductor and the mounting conductor. The mounting conductor is terminated to the first PCB. The flexible conductor allows the mating conductor to move in a connector mating direction along a connector mating axis relative to the mounting conductor. The flexible conductor has a bent portion changing shape when the flexible conductor is flexed. The first electrical connector has ground contacts extending along corresponding first contacts and providing electrical shielding for the first contacts. The ground contacts include covers extending along and providing shielding along at least one side of the bent portion of the corresponding first contact. The second circuit card assembly has a second PCB and a second electrical connector mounted to the second PCB. The second electrical connector has a second mating end and second contacts at the second mating end mated with mating conductors of corresponding first contacts. The second electrical connector has a header housing holding the second contacts. At least one of the first PCB and the second PCB includes a slot receiving the other of the first PCB and the second PCB in a board loading direction along a board loading axis. The mating conductors are coupled to corresponding second contacts in the connector mating direction generally perpendicular to the board loading direction.

BRIEF DESCRIPTION OF THE DRAWINGS

FIG. 3 is a top view of a portion of the communication system showing the first circuit card assembly poised for mating with the second circuit card assembly.

FIG. 4 is a top view of a portion of the communication system showing the first circuit card assembly mated to the second circuit card assembly.

FIG. 5 is a perspective view of a portion of the communication system showing the first circuit card assembly and the second circuit card assembly poised for mating.

FIG. 6 is a perspective view of a portion of the communication system in accordance with an exemplary embodiment.

FIG. 7 is a perspective view of a portion of the communication system in accordance with an exemplary embodiment.

FIG. 15 is a top view of a portion of the first electrical connector in accordance with an exemplary embodiment.

FIG. 16 is a top view of a portion of the first electrical connector in accordance with an exemplary embodiment.

FIG. 17 is a top view of a portion of the first electrical connector in accordance with an exemplary embodiment.

FIG. 18 is a top view of a portion of the first electrical connector in accordance with an exemplary embodiment.

DETAILED DESCRIPTION OF THE INVENTION

Figure 1:
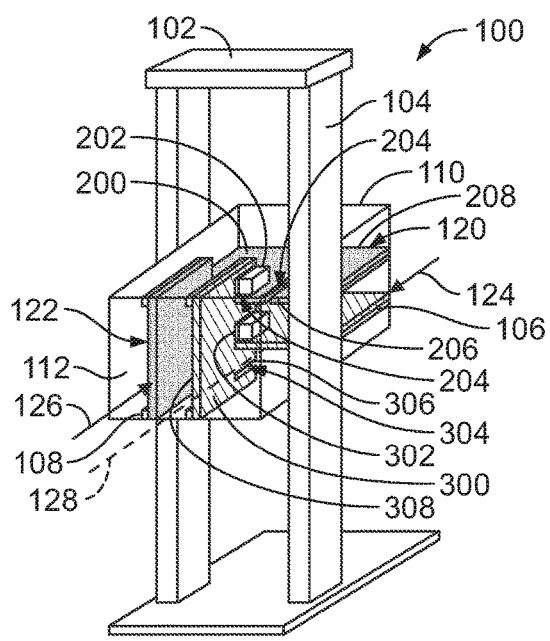
FIG. 1 illustrates a communication system formed in accordance with an exemplary embodiment.

FIG. 1 illustrates a communication system 100 formed in accordance with an exemplary embodiment. The communication system 100 includes a chassis 102 having a frame 104 configured to hold communication components, such as network components, such as circuit card assemblies. Optionally, the chassis 102 may include a cabinet (not shown) surrounding components of the communication system 100. In an exemplary embodiment, the frame 104 includes a plurality of racks 106, 108 for holding circuit card assemblies. For example, the communication system 100 may form part of a data center switch having one or more backplanes and/or daughter cards, such as line cards, switch cards or other types of circuit cards that may be electrically connected together.

In an exemplary embodiment, the communication system 100 includes a front end 110 and a rear end 112. The racks 106 are provided at the front end 110 and the racks 108 are provided at the rear end 112. One or more circuit card assemblies 120 may be received in the racks 106 at the front end 110 and one or more circuit card assemblies 122 may be received in the racks 108 at the rear end 112. The circuit card assemblies 120 may be referred to hereinafter as first circuit card assemblies 120 or front circuit card assemblies to differentiate from the circuit card assemblies 122, which may be referred to hereinafter as second circuit card assemblies 122 and/or rear circuit card assemblies 122. In an exemplary embodiment, the circuit card assemblies 120, 122 are orthogonal to each other. For example, in the illustrated embodiment, the front circuit card assemblies 120 are oriented horizontally while the rear circuit card assemblies 122 are oriented vertically; however, other orientations are possible in alternative embodiments.

The front circuit card assemblies 120 are electrically connected to one or more of the rear circuit card assemblies 122. Optionally, the front circuit card assemblies 120 and/or the rear circuit card assemblies 122 may be removable from the corresponding racks 106, 108. The racks 106, 108 guide and position the circuit card assemblies 120, 122, respectively. For example, the racks 106 position the front circuit card assemblies 120 for mating with multiple rear circuit card assemblies 122 and the racks 108 position the rear circuit card assemblies 122 for mating with multiple front circuit card assemblies 120. The front circuit card assemblies 120 may be loaded into the frame 104 through the front end 110 while the rear circuit card assemblies 122 may be loaded into the frame 104 through the rear end 112. For example, the front circuit card assemblies 120 are configured to be loaded into corresponding racks 106 in a loading direction 124 and the rear circuit card assemblies 122 are configured to be loaded into corresponding racks 108 in a loading direction 126. The loading directions 124, 126 may be parallel to a loading axis 128.

The first circuit card assembly 120 includes a first printed circuit board (PCB) 200 and a first electrical connector 202 mounted to the first PCB 200. The first PCB 200 may include any number of the electrical connectors 202, such as one electrical connector 202 for electrically connecting to each corresponding second circuit card assembly 122. Optionally, the first PCB 200 may include one or more first slots 204 for receiving PCBs of corresponding second circuit card assemblies 122 when mated thereto.

Figure 2:
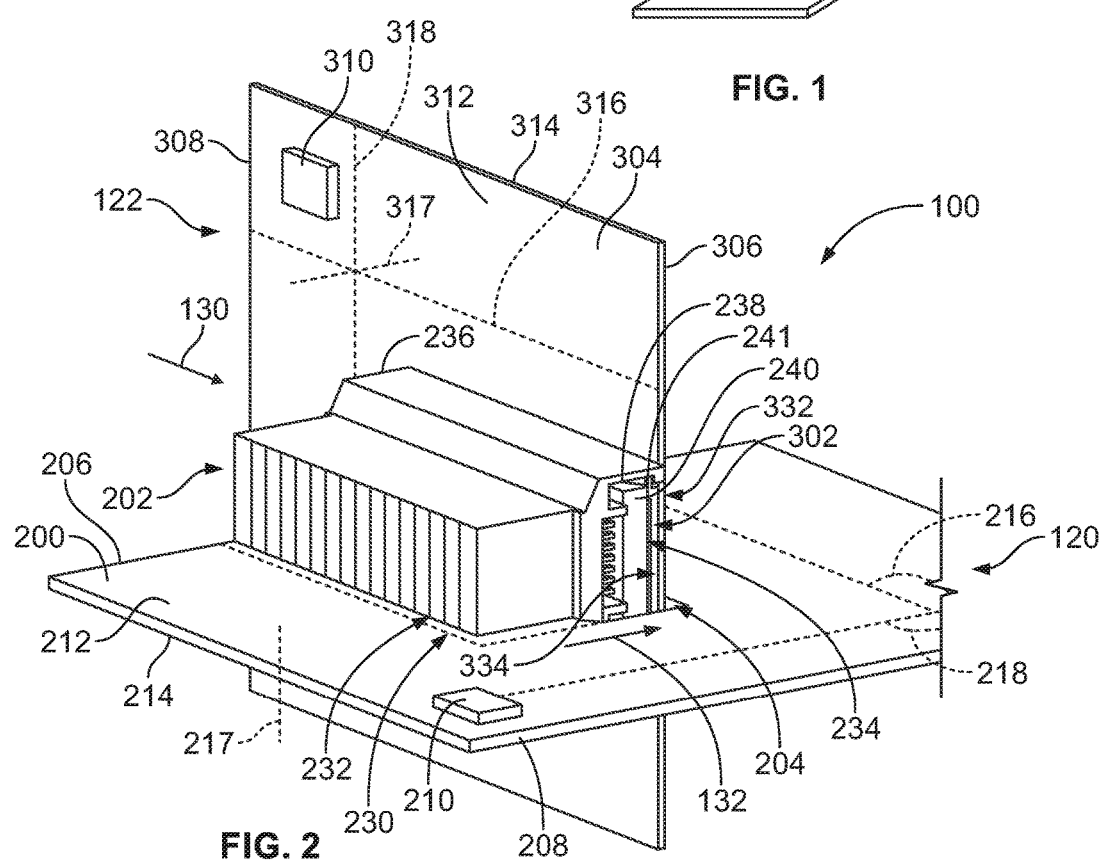
FIG. 2 is a perspective view of a portion of the communication system showing a first circuit card assembly coupled to a second circuit card assembly.

The first PCB 200 extends between a first mating edge 206 at a front of the PCB 200 and a rear edge 208 opposite the mating edge 206. Optionally, the rear edge 208 may include a handle or other feature for insertion and removal of the first circuit card assembly 120. The first PCB 200 may include one or more electrical components 210 (such as shown in FIG. 2) thereon. For example, the electrical components 210 may be processors, memory modules, batteries, fans, signal processing devices, and the like.

The second circuit card assembly 122 includes a second PCB 300 and a second electrical connector 302 mounted to the second PCB 300. The second PCB 300 may include any number of the electrical connectors 302, such as one electrical connector 302 for electrically connecting to each corresponding first circuit card assembly 120. The second PCB 300 extends between a second mating edge 306 at a front of the PCB 300 and a rear edge 308 opposite the mating edge 306. The first and second mating edges 206, 306 of the first and second PCBs 200, 300 interface with each other when the first and second circuit card assemblies 120, 122 are mated. For example, the fronts of the PCBs 200, 300 face each other and the rear edges 208, 308 face away from each other. Optionally, the rear edge 308 may include a handle or other feature for insertion and removal of the second circuit card assembly 122. The second PCB 300 may include one or more electrical components 310 (such as shown in FIG. 2) thereon. For example, the electrical components 310 may be processors, memory modules, batteries, fans, signal processing devices, and the like.

Optionally, the second PCB 300 may include one or more second slots 304 for receiving first PCBs 200 of corresponding first circuit card assemblies 120 when mated thereto. In various embodiments, both PCBs 200, 300 include the first and second slots 204, 304. In other various embodiments, only the first PCB 200 includes the first slots 204, whereas in other various embodiments, only the second PCB 300 includes the second slots 304.

The first slots 204 and/or the second slots 304 allow the first and second PCBs 200, 300 to be internested and overlapping such that the first and second electrical connectors 202, 302 are aligned for mating. For example, the first slots 204 and/or the second slots 304 allow the first and second PCBs 200, 300 to overlap to align mating ends of the first and second electrical connectors 202, 302 for mating. The arrangement allows the first and second electrical connectors 202, 302 to be mated in a mating direction perpendicular to the loading directions 124, 126. During mating, the first and second PCBs 200, 300 and the first and second electrical connectors 202, 302 may be loaded or mated together in a board loading direction 130 (FIG. 2) and at the end of the mating process the first and second electrical connectors 202, 302 may be mated in a connector mating direction 132 (FIG. 2) perpendicular to the board loading direction 130.

Having the first and second circuit card assemblies 122 internested and overlapped using the slot(s) 204, 304 allows the first and second electrical connectors 202, 302 to be elongated along the PCBs 200, 300 reducing one or more other dimensions of the electrical connectors 202, 302 (for example, a height and/or a width) allowing a greater amount of airflow through the communication system 100 (for example, from the front end 110 to the rear end 112 and/or from the rear end 112 to the front end 110. The arrangement may allow the PCBs 200, 300 to overlap to reduce one or more dimensions of the communication system 100, such as a front to rear length of the communication system 100.

FIG. 2 is a perspective view of a portion of the communication system 100 showing the first circuit card assembly 120 coupled to the second circuit card assembly 122; however, it is noted that the first circuit card assembly 120 may be designed to be coupled to multiple circuit card assemblies 122 and/or the second circuit card assembly 122 may be designed to be coupled to multiple circuit card assemblies 120, such as in the arrangement illustrated in FIG. 1. FIG. 3 is a top view of a portion of the communication system 100 showing the first circuit card assembly 120 poised for mating to the second circuit card assembly 122. FIG. 4 is a top view of a portion of the communication system 100 showing the first circuit card assembly 120 coupled to the second circuit card assembly 122. FIG. 5 is a perspective view of a portion of the communication system 100 showing the first circuit card assembly 120 and the second circuit card assembly 122 poised for mating.

The terms "first", "second", etc. are used merely as labels to generally identify components of the first circuit card assembly 120 or the second circuit card assembly 122, respectively; however, such labels are not used exclusively with the circuit card assemblies 120, 122. Either or both of the circuit card assemblies 120, 122 may include any of the various components or elements described herein and some components may only be described with respect to either the circuit card assembly 120 or the circuit card assembly 122; however, the other of the circuit card assembly 120 or the circuit card assembly 122 may additionally include such components. Furthermore, the components may be described herein with or without the "first" label or the "second" label.

The first circuit card assembly 120 includes the PCB 200 having the first slot 204 and the electrical connector 202 mounted to the PCB 200 proximate to the first slot 204. The PCB 200 includes a first surface 212 and a second surface 214 being the main surfaces of the PCB 200. In the illustrated embodiment, the first surface 212 is an upper surface and the second surface 214 is a lower surface; however, the PCB 200 may have other orientations in alternative embodiments. The first and second surfaces 212, 214 extend along a primary axis 216 and a secondary axis 218 perpendicular to the primary axis 216. The PCB 200 has a thickness between the first and second surfaces 212, 214 along a transverse axis 217 perpendicular to the primary and secondary axes 216, 218. In an exemplary embodiment, the primary and secondary axes 216, 218 are in a horizontal plane and the transverse axis 217 extends in a vertical direction; however, the PCB 200 may have other orientations in alternative embodiments. In an exemplary embodiment, the primary axis 216 extends between the mating edge 206 and the rear edge 208 (shown in FIG. 1). In an exemplary embodiment, the secondary axis 218 is parallel to the mating edge 206.

The first slot 204 extends entirely through the PCB 200 between the first and second surfaces 212, 214. The first slot 204 is open at the mating edge 206 to receive the second circuit card assembly 122. The first slot 204 extends a length along the primary axis 216 to an end edge 220 (shown in FIGS. 4 and 5) remote from the mating edge 206. The first slot 204 has first and second side edges 222, 224 extending between the mating edge 206 and the end edge 220. Optionally, the side edges 222, 224 may be generally parallel to each other. Alternatively, the side edges 222, 224 may be nonparallel, such as to taper the first slot 204. For example, the first slot 204 may be wider near the mating edge 206 and narrower near the end edge 220. Optionally, the side edges 222, 224 may have chamfered lead-ins at the mating edge 206 to guide the second circuit card assembly 122 into the first slot 204.

The first PCB 200 includes a mounting area 230 for the electrical connector 202 on the first surface 212. The mounting area 230 is adjacent the first slot 204. For example, the mounting area 230 extends along the mating edge 206 a distance from the first slot 204 and extends along the first side edge 222 of the first slot 204 a distance from the mating edge 206. Optionally, the mounting area 230 may extend beyond the end edge 220 of the first slot 204. The electrical connector 202 is terminated to the PCB 200 at the mounting area 230. For example, contacts 228 that extend through the electrical connector 202 may be soldered to the PCB 200 at the mounting area 230. The mounting area 230 may include plated vias that receive compliant pins or solder tails of the contacts 228 of the electrical connector 202 for termination of the contacts 228 to the PCB 200. Optionally, at least a portion of the electrical connector 202 may extend beyond the first side edge 222 over the first slot 204 and/or at least a portion of the electrical connector 202 may extend forward of the mating edge 206 and/or at least a portion of the electrical connector 202 may extend rearward of the end edge 220. In other various embodiments, the PCB 200 may include more than one mounting area 230 adjacent the first slot 204 for receiving additional electrical connectors 202. For example, multiple electrical connectors 202 may be electrically connected to the same circuit card assembly 122.

For example, additional electrical connectors 202 may be provided on both sides of the first slot 204 and/or both sides of the PCB 200.

The first electrical connector 202 is mounted to the first PCB 200 at the mounting area 230. In the illustrated embodiment, the electrical connector 202 is a right angle connector having a mounting end 232 perpendicular to a mating end 234. For example, the mounting end 232 may be provided at a bottom of the electrical connector 202 and the mating end 234 may be provided at a side of the electrical connector 202. The electrical connector 202 extends between a front 236 and a rear 238 opposite the front 236. The mounting end 232 extends between the front 236 and the rear 238 at the bottom of the electrical connector 202. The mounting end 232 is mounted to the PCB 200. For example, the electrical connector 202 is mechanically and electrically terminated to the PCB 200 at the mounting end 232. The mating end 234 extends between the front 236 and the rear 238. In the illustrated embodiment, the mating end 234 generally faces the first slot 204 for interfacing with the second electrical connector 302 when the second circuit card assembly 122 is received in the first slot 204. The mating end 234 is configured to be mated to the mating electrical connector defined by the second electrical connector 302 when the second circuit card assembly 122 is received in the first slot 204.

In an exemplary embodiment, the mating end 234 is oriented generally vertically along the transverse axis 217 and extends parallel to the primary axis 216. The mating end 234 faces sideways rather than forward. For example, the mating end 234 is perpendicular to the mating edge 206 of the PCB 200. The front 236 is oriented generally vertically along the transverse axis 217 and extends parallel to the secondary axis 218. The front 236 may be positioned a first distance from the mating edge 206 (either forward of, rearward of or flush with the mating edge 206) and the rear 238 is positioned a second distance from the mating edge 206 greater than the first distance. The mating end 234 spans a majority of the distance between the front 236 and the rear 238. The front 236 is forward facing and, in the illustrated embodiment, is provided near the mating edge 206, such as generally flush with the mating edge 206.

The second circuit card assembly 122 includes the second PCB 300, which may or may not include a slot. In the illustrated embodiment, the PCB 300 does not include a slot. The PCB 300 includes a first surface 312 and a second surface 314 being the main surfaces of the PCB 300. In the illustrated embodiment, the first surface 312 defines a first side and the second surface 314 defines a second side of the PCB 300; however, the PCB 300 may have other orientations in alternative embodiments. The first and second surfaces 312, 314 extend along a primary axis 316 and a secondary axis 318 perpendicular to the primary axis 316. The PCB 300 has a thickness between the first and second surfaces 312, 314 along a transverse axis 317 perpendicular to the primary and secondary axes 316, 318. In an exemplary embodiment, the primary and secondary axes 316, 318 are in a vertical plane and the transverse axis 317 extends in a horizontal direction; however, the PCB 300 may have other orientations in alternative embodiments. In an exemplary embodiment, the primary axis 316 extends between the mating edge 306 and the rear edge 308 (shown in FIG. 1). In an exemplary embodiment, the secondary axis 318 is parallel to the mating edge 306.

In an exemplary embodiment, at least a portion of the PCB 300 is configured to be received in the first slot 204 that may at least partially fill the first slot 204. Such portion may engage the end edge 220, the first side edge 222 and/or the second side edge 224 of the first slot 204 when received therein.

The second PCB 300 includes a mounting area 330 for the electrical connector 302 on the first surface 312. The mounting area 330 extends from the mating edge 306 a distance. The electrical connector 302 is terminated to the PCB 300 at the mounting area 330. For example, contacts 328 (shown in FIG. 13) of the electrical connector 302 may be soldered to the PCB 300 at the mounting area 330. The mounting area 330 may include plated vias that receive compliant pins or solder tails of the contacts 328 of the electrical connector 302 for termination of the contacts 328 to the PCB 300. Optionally, at least a portion of the electrical connector 302 may extend forward of the mating edge 306. In other various embodiments, the PCB 300 may include more than one mounting area 330 for receiving additional electrical connectors 302. For example, multiple electrical connectors 302 may be electrically connected to the same circuit card assembly 122.

The second electrical connector 302 is mounted to the second PCB 300 at the mounting area 330. In the illustrated embodiment, the electrical connector 302 is a header connector having a mounting end 332 parallel to a mating end 334. For example, the mounting end 332 may be provided along one side of the electrical connector 302 and the mating end 334 may be provided at the opposite side of the electrical connector 302. Optionally, the mounting end 332 and the mating end 334 may be parallel to each other and non-coplanar. The electrical connector 302 extends between a front 336 and a rear 338 opposite the front 336. The mounting end 332 and the mating end 334 both extend between the front 336 and the rear 338. The mounting end 332 is mounted to the PCB 300. For example, the electrical connector 302 is mechanically and electrically terminated to the PCB 300 at the mounting end 332. In the illustrated embodiment, the mating end 334 is oriented for interfacing with the first electrical connector 202 when the second circuit card assembly 122 is received in the first slot 204.

In an exemplary embodiment, the mating end 334 is oriented generally vertically and extends parallel to the primary axis 316. The mating end 334 faces sideways rather than forward. For example, the mating end 334 is perpendicular to the mating edge 306 of the PCB 300. The front 336 is oriented generally vertically and extends parallel to the secondary axis 318. The front 336 may be positioned a first distance from the mating edge 306 (either forward of, rearward of or flush with the mating edge 306) and the rear 338 is positioned a second distance from the mating edge 306 greater than the first distance. The mating end 334 spans a majority of the distance between the front 336 and the rear 338. The front 336 is forward facing and, in the illustrated embodiment, is provided near the mating edge 306, such as generally flush with the mating edge 306.

When the first and second circuit card assemblies 120, 122 are mated, the first and second PCBs 200, 300 are internested and the second PCB 300 is received in the first slot 204. When mated, the first PCB 200 at least partially overlaps with the second PCB 300 to align the mating ends 234, 334 of the electrical connectors 202, 302. For example, the mating edges 206, 306 bypass each other as the second PCB 300 is received in the first slot 204. During mating, the contacts 328 are moved in a board loading direction 130 (for example, parallel to the primary axis 316 of the PCB 300) and the contacts 228 are moved in a connector mating direction 132 (for example, sideways or perpendicular to the board loading direction 130) as the first and second electrical connectors 202, 302 are mated. For example, a portion of the first electrical connector 202 is moved toward the second electrical connector 312. In an exemplary embodiment, the first contacts 228 include flexible sections to allow the first contacts 228 to move in the connector mating direction 132. For example, while the mounting portions of the first contacts 228 remain fixed to the first PCB 200, the mating portions of the first contacts 228 may be moved in the connector mating direction for mating with the second contacts 328. As described in further detail below, the flexible sections of the first contacts allow such relative movement.

FIG. 6 is a perspective view of a portion of the communication system 100 in accordance with an exemplary embodiment. FIG. 6 shows the second circuit card assembly 122 with the second slot 304 and the first circuit card assembly 120 without the first slot 204 (shown in FIG. 5). Optionally, at least a portion of the first PCB 200 is configured to at least partially fill the second slot 304. The second electrical connector 302 is mounted to the mounting area 330 adjacent the second slot 304. When the first and second circuit card assemblies 120, 122 are mated, the first and second PCBs 200, 300 are internested with the first PCB 200 being received in the second slot 304. When mated, the first PCB 200 at least partially overlaps with the second PCB 300 to align the mating ends 234, 334 of the electrical connectors 202, 302. For example, the mating edges 206, 306 bypass each other as the first PCB 200 is received in the second slot 304.

FIG. 7 is a perspective view of a portion of the communication system 100 in accordance with an exemplary embodiment. FIG. 7 shows the first circuit card assembly 120 with the first slot 204 and the second circuit card assembly 122 with the second slot 304. When the first and second circuit card assemblies 120, 122 are mated, the first and second PCBs 200, 300 are internested with the first PCB 200 being received in the second slot 304 and with the second PCB 300 being received in the first slot 204. When mated, the first PCB 200 at least partially overlaps with the second PCB 300 to align the mating ends 234, 334 of the electrical connectors 202, 302. For example, the mating edges 206, 306 bypass each other as the PCBs 200, 300 are received in the second and first slots 304, 204, respectively.

Figure 8:
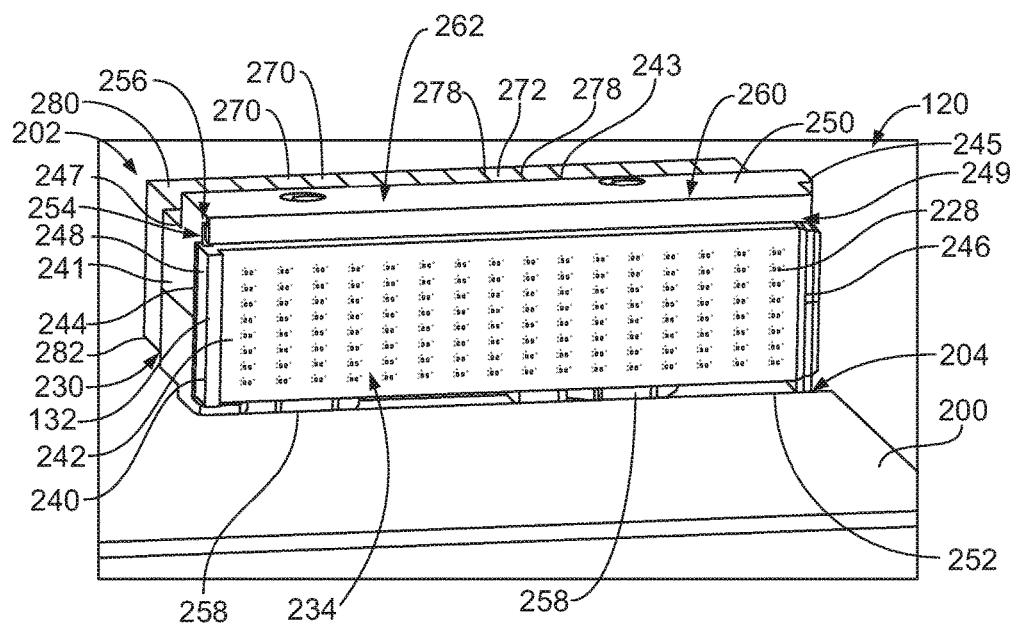
FIG. 8 is a top perspective view of a portion of the first circuit card assembly showing the first electrical connector mounted to a first PCB.
Figure 9:
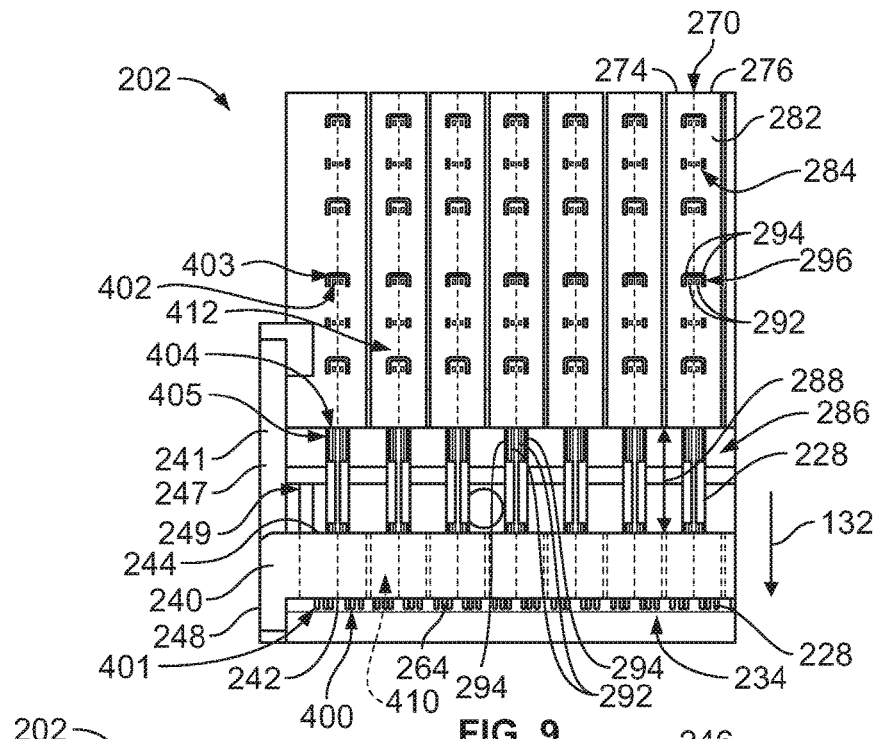
FIG. 9 is a sectional bottom view of a portion of first electrical connector of the first circuit card assembly in accordance with an exemplary embodiment.
Figure 10:
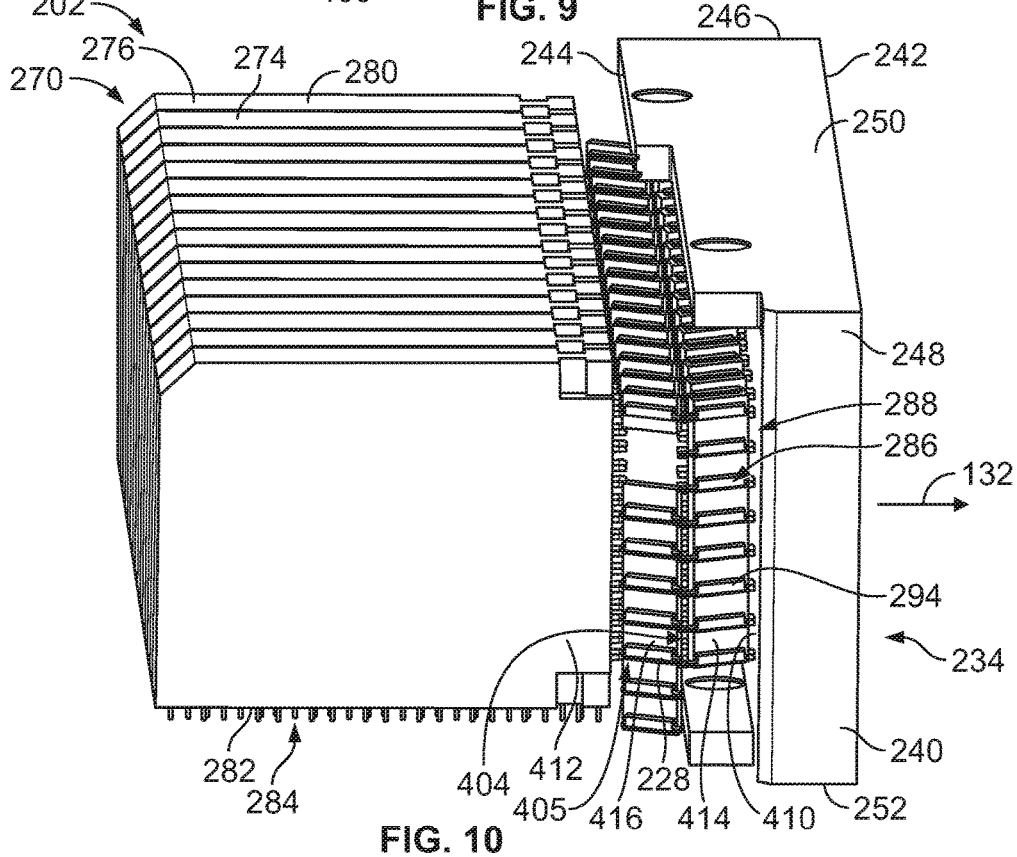
FIG. 10 is a perspective view of a portion of the first electrical connector in accordance with an exemplary embodiment.
Figure 11:
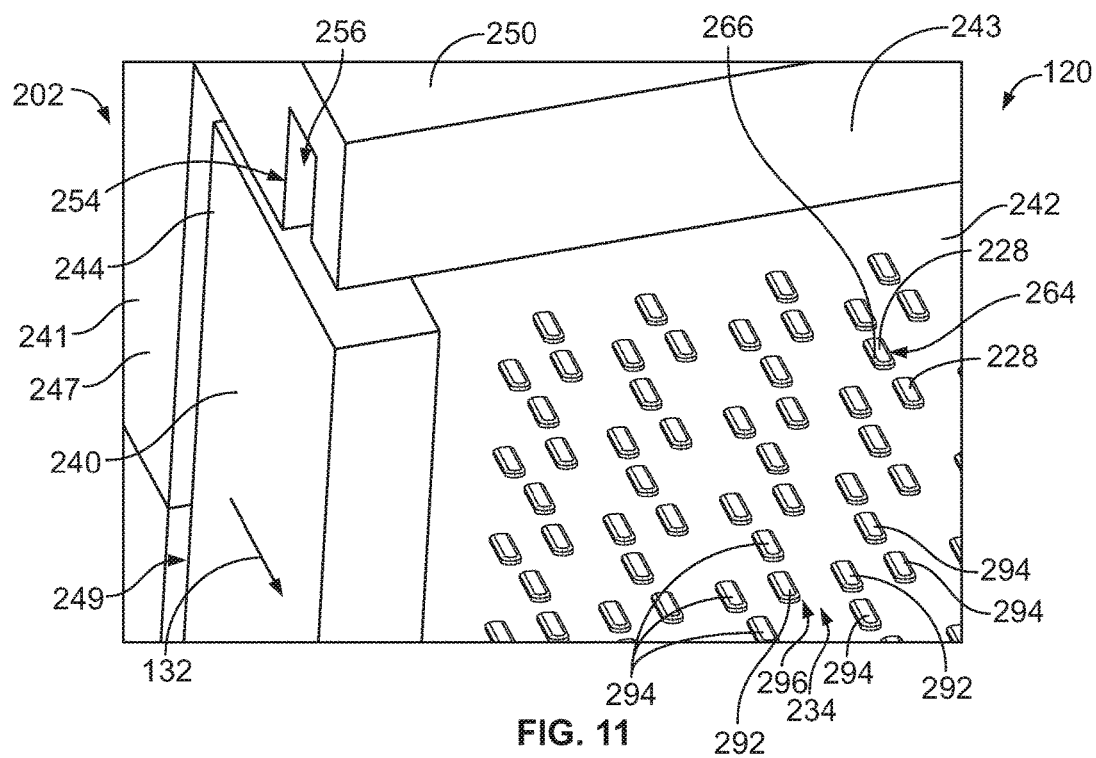
FIG. 11 is an end view of a portion of the first electrical connector in accordance with an exemplary embodiment.

FIG. 8 is a side perspective view of the first electrical connector 202 in accordance with an exemplary embodiment. FIG. 9 is a sectional bottom view of a portion of the first electrical connector 202 in accordance with an exemplary embodiment. FIG. 10 is a perspective view of a portion of the first electrical connector 202 in accordance with an exemplary embodiment. FIG. 11 is a side perspective view of a portion of the first electrical connector 202 in accordance with an exemplary embodiment.

In an exemplary embodiment, the first electrical connector 202 includes a mating housing 240 at the mating end 234 and a receptacle housing 241 (removed in FIG. 10 to illustrate other components) surrounding at least a portion of the mating housing 240. The mating housing 240 is movable within the receptacle housing 241, such as in the connector mating direction 132. Such movement allows mating of the first contacts 228 with the second contacts 328 of the second electrical connector 302.

In an exemplary embodiment, the first contacts 228 include signal contact 292 and ground contacts 294 providing electrical shielding for the signal contacts 292. The first contacts 228 are flexible to allow movement of the mating housing 240 relative to the receptacle housing 241. For example, in an exemplary embodiment, the signal contacts 294 each include a mating conductor 400, a mounting conductor 402 and a flexible conductor 404 therebetween and the ground contacts 294 each include a mating conductor 401, a mounting conductor 403 and a flexible conductor 405 therebetween. The mating conductors 400, mounting conductors 402 and flexible conductors 404 may be part of leadframes that are stamped from a common sheet of metal. The mating conductors 401, mounting conductors 403 and flexible conductors 405 may be part of leadframes that are stamped from a common sheet of metal. The mating conductors 400, 401 are configured to be held by the mating housing 240 and are configured to be mated with corresponding second contacts 328. The mounting conductors 402, 403 are configured to be held by the receptacle housing 241 and are configured to be terminated to the first PCB 200.

In an exemplary embodiment, the signal contacts 292 may be arranged in pairs configured to convey differential signals, which are surrounded or flanked by a corresponding pair of ground contacts 294. Optionally, multiple mating conductors 400 may be held together by a common structure, such as a dielectric body, such as an overmolded dielectric body, which may be received in and held by the mating housing 240. Optionally, multiple mounting conductors 402 may be held together by a common structure, such as a dielectric body, such as an overmolded dielectric body, which may be received in and held by the receptacle housing 241. For example, the first contacts 228 may be an overmolded leadframe having discrete overmolded portions with exposed portions of the leadframe between various overmolded portions.

The flexible conductors 404, 405 flex to allow relative movement between the mating conductors 400, 401 and the mounting conductor 402, 403. In an exemplary embodiment, the flexible conductors 404, 405 include at least one bend that may be flexed to allow relative movement. For example, the flexible conductors 404 may be V-shaped, W-shaped, Z-shaped, or have another angular shape including at least one bend or may be curved including curved bends rather than angled bends. Optionally, multiple flexible conductors 404 may be held together by a common structure, such as a dielectric body, such as an overmolded dielectric body.

The mating housing 240 includes a first side 242, a second side 244, a front 246 and a rear 248. The first side 242 defines the mating end 234 of the electrical connector 202. The mating end 234 is oriented perpendicular to the first PCB 200. In an exemplary embodiment, the mating housing 240 holds portions of the contacts 228 for mating with the second electrical connector 302 (shown in FIG. 2). For example, each of the contacts 228 includes a mating end 264 (FIG. 11) extending beyond the first side 242 for mating with the second electrical connector 302. The mating ends 264 are provided at the first side 242 in a predetermined layout for mating with the second electrical connector 302. The mating ends 264 have mating interfaces 266 (FIG. 11) configured to engage the mating contact 328 (shown in FIG. 4) when mated thereto. Other types of mating ends may be provided in alternative embodiments, such as spring beams, pins, sockets, and the like.

The receptacle housing 241 includes end walls 243 extending between a front wall 245 and a rear wall 247. The walls 243, 245, 247 define a cavity 249 that receives the mating housing 240. In an exemplary embodiment, the end walls 243 are provided at a top 250 and a bottom 252 of the first electrical connector 202. In an exemplary embodiment, the first electrical connector 202 include connecting elements 254 (FIG. 11) at the top 250 and the bottom 252 for connecting the first electrical connector 202 to the second electrical connector 302. In the illustrated embodiment, the connecting elements 254 are defined by grooves 256 in the receptacle housing 241 at the top 250 and the bottom 252 configured to receive portions of the second electrical connector 302. The connecting elements 254 secure the receptacle housing 241 to the second electrical connector 302 as the electrical connectors 202, 302 are coupled together (for example, as the PCBs 200, 300 are moved in the board loading direction). Other types of connecting elements 254 may be provided in alternative embodiments, such as pins, clips, fasteners, and the like.

The electrical connector 202 includes drive members 258 (FIG. 8) at the top 250 and the bottom 252 for actuating the mating housing 240 relative to the receptacle housing 241 during mating. The drive members 258 may be positioned in the cavity 249, such as at the end wall(s) 243 at the top 250 and/or at the bottom 252. The drive members 258 are operably coupled to the receptacle housing 241 and operably coupled to the mating housing 240. As the drive members 258 are operated, the drive members 258 move the mating housing 240 sideways relative to the receptacle housing 241 in the connector mating direction 132. In an exemplary embodiment, the drive members 258 may be actuated by engagement with the second electrical connector 302 as the first and second electrical connectors 302 are coupled together. For example, actuators, such as ramps, may be provided on the second electrical connector 302 to actuate the drive members 258 as the drive members engage the actuators. In an exemplary embodiment, multiple drive members 258 are provided, such as at a front section 260 and a rear section 262 of the electrical connector 202. In an exemplary embodiment, the drive members 258 are cam levers; however, other types of drive members 258 may be provided in alternative embodiments, such as cam pins configured to be received in cam sockets, pinions configured to engage a rack, a crank configured to engage a rack, a crank configured to engage an idler gear, one or more linkages configured to engage an actuator, and the like.

In an exemplary embodiment, the electrical connector 202 includes contact modules 270 each holding a plurality of the first contacts 228. The contact modules 270 may be coupled to the receptacle housing 241 and/or the mating housing 240, such as at the second side 244. For example, in the illustrated embodiment, the contact modules 270 are loaded into the receptacle housing 241 behind the mating housing 240. In an exemplary embodiment, each contact module 270 includes an inner dielectric body 410 holding the mating conductors 400 and/or 401 in the mating housing 240, an outer dielectric body 412 separate and discrete from the inner dielectric body 410 holding the mounting conductors 402 and/or 403 in the receptacle housing 241, a first intermediate dielectric body 414 holding first portion(s) of corresponding flexible conductor(s) 404 and/or 405 and a second intermediate dielectric body 416 holding second portion(s) of corresponding flexible conductor(s) 404 and/or 405. In an exemplary embodiment, the first dielectric body 414 holds all of the signal contacts of the first contacts 228 and the second dielectric body 416 holds all of the signal contacts of the first contacts 228. Alternatively, multiple dielectric bodies may be provided with each holding a single signal contact of the first contacts. Optionally, the first and second dielectric bodies 414, 416 may hold all of the ground contacts 294. For example, the first and second dielectric bodies 414, 416 may include slots receiving and holding corresponding ground contacts 294. The flexible conductors 404 extend between the inner dielectric body 410 and the outer dielectric body 412 and are flexible therebetween to allow relative movement of the mating conductors 400, the inner dielectric body 410 and the mating housing 240 in the connector mating direction 132 relative to the mounting conductors 402, the outer dielectric body 412 and the receptacle housing 241. In an exemplary embodiment, the dielectric bodies 410, 412, 414, 416 are overmolded dielectric bodies overmolded around corresponding portions of the first contacts 228.

In an exemplary embodiment, each contact modules 270 includes two contact module sub-assemblies 274, 276 coupled together to form the contact module 270. The contact module sub-assemblies 274, 276 may be mirrored halves. Both of the contact module sub-assemblies 274, 276 may include corresponding contacts 228 and dielectric bodies 410, 412, 414, 416. The signal contacts 292 of the first contact module sub-assembly 274 are paired with corresponding signal contacts 292 of the second contact module sub-assembly 276 to form the signal pairs of the contact module 270. The contact modules 270 are stacked front to rear within the electrical connector 202. Any number of the contact modules 270 may be stacked together depending on the particular application. The number of contacts 228 within the electrical connector 202 may be increased or decreased by changing the number of contact modules 270 rather than retooling to increase the number of contacts per contact module, as is common in conventional systems, such retooling being expensive. The contact module 270 includes a top 280 and a bottom 282. The bottom 282 is configured to be mounted to the first PCB 200 (FIG. 8). Optionally, the mounting conductors 402, 403 of the contacts 228 may extend below the bottom 282 for termination to the first PCB 200. For example, each of the contacts 228 may include a terminating end 284 (FIG. 9) configured to be terminated to the first PCB 200. For example, the terminating end 284 may be a compliant pin, such as an eye of the needle pin, configured to be press-fit into plated vias in the first PCB 200. In other various embodiments, the terminating end 284 may be a solder tail or another type of terminating end.

In an exemplary embodiment, the electrical connector 202 includes a compliant section 286 between the inner dielectric bodies 410 and the outer dielectric bodies 412 that allows the mating housing 240 and the inner dielectric bodies 410 to shift relative to the outer dielectric bodies 412, such as during mating with the second electrical connector 302. For example, a gap 288 may be provided between the inner dielectric bodies 410 and the outer dielectric bodies 412. The flexible conductors 404, 405 span the gap 288 and the first and second intermediate dielectric bodies 414, 416 are positioned in the gap 288. The flexible conductors 404 allow relative movement between the first and second intermediate dielectric bodies 414, 416 as well as allowing relative movement between the first intermediate dielectric body 414 and the inner dielectric body 410 and allowing relative movement between the second intermediate dielectric body 416 and the outer dielectric body 412. Portions of the flexible conductors 404 are not encased or enclosed by the intermediate dielectric bodies 414, 416 and are free to bend and change shape to allow relative movement. Optionally, the flexible conductors 404, 405 and the intermediate dielectric bodies 414, 416 are enclosed or shrouded by a portion of the electrical connector 202, such as a shroud of the receptacle housing 241 and/or the mating housing 240.

Optionally, the signal contacts 292 may be arranged in pairs 296 configured to convey differential signals. The ground contacts 294 are interspersed with the signal contacts 292 to provide electrical shielding for the signal contacts 292. For example, the ground contacts 294 may be provided between the pairs 296 of signal contacts 292. Optionally, the ground contacts 294 may be provided above, below, and/or between the various pairs 296 of signal contacts 292. The signal contacts 292 and/or the ground contacts 294 may be stamped and formed contacts.

As shown in FIG. 8, the bottoms 282 of the contact modules 270 are mounted to the PCB 200. In an exemplary embodiment, the mating housing 240 is positioned above the first slot 204 for mating with the second electrical connector 302 (shown in FIG. 2). In an exemplary embodiment, the mating housing 240 is movable relative to the PCB 200 and the contact modules 270, which are fixed to the PCB 200. For example, the flexible sections of the contacts 228 defining the compliant section 286 of the electrical connector 202 allow the mating housing 240 to move relative to the PCB 200 during mating with the second electrical connector 302.

Figure 12:
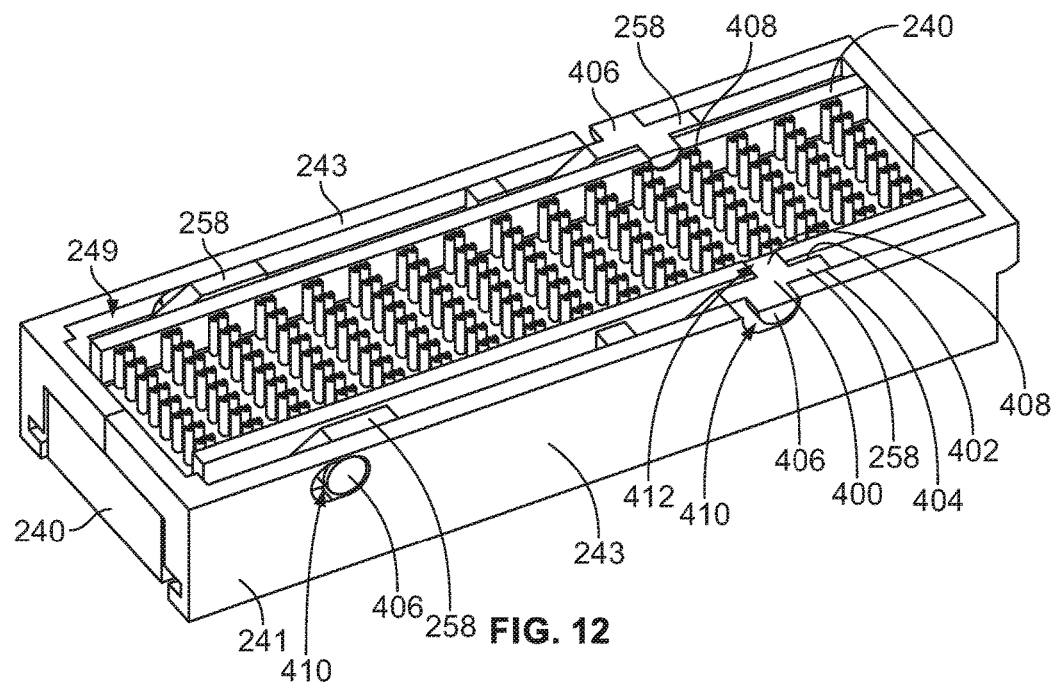
FIG. 12 is a partial sectional view of a portion of the first electrical connector in accordance with an exemplary embodiment.

FIG. 12 is a rear perspective, partial sectional view of a portion of the first electrical connector 202. FIG. 12 shows the mating housing 240 positioned in the cavity 249 and shows the flexible conductors 404, 405 in the cavity 249. The drive members 258 are positioned between the mating housing 240 and the receptacle housing 241. In the illustrated embodiment, the drive members 258 are cam levers for moving the mating housing 240 relative to the receptacle housing 241.

Figure 13:
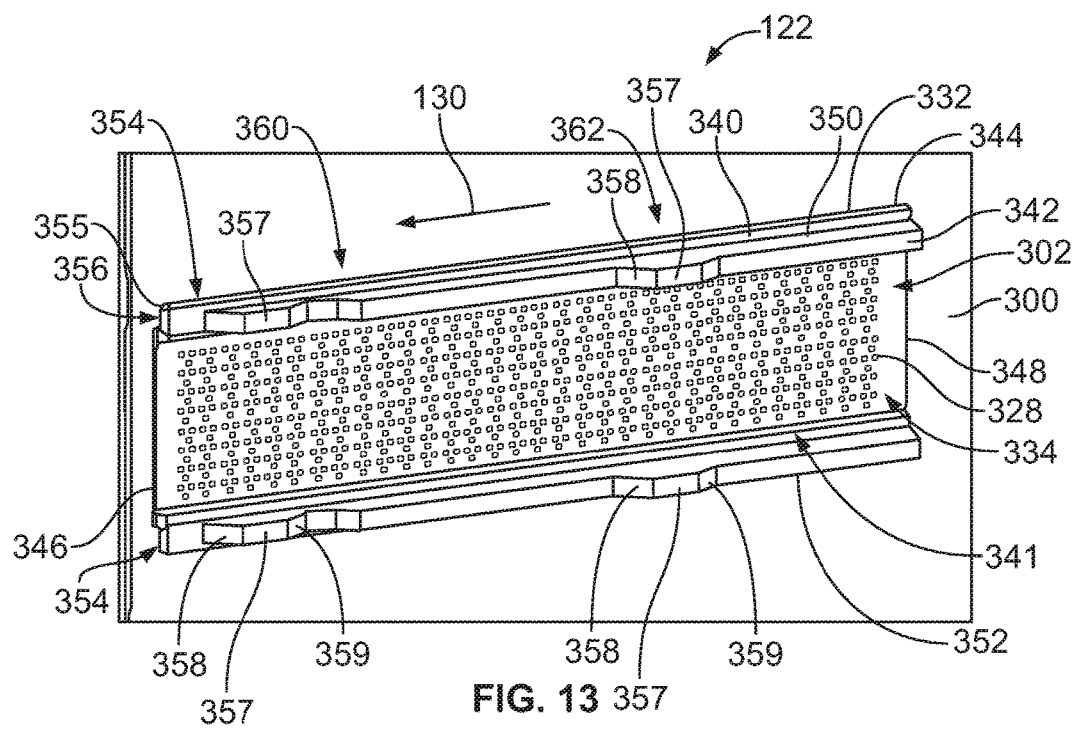
FIG. 13 is a perspective view of a portion of the second circuit card assembly in accordance with an exemplary embodiment.
Figure 14:
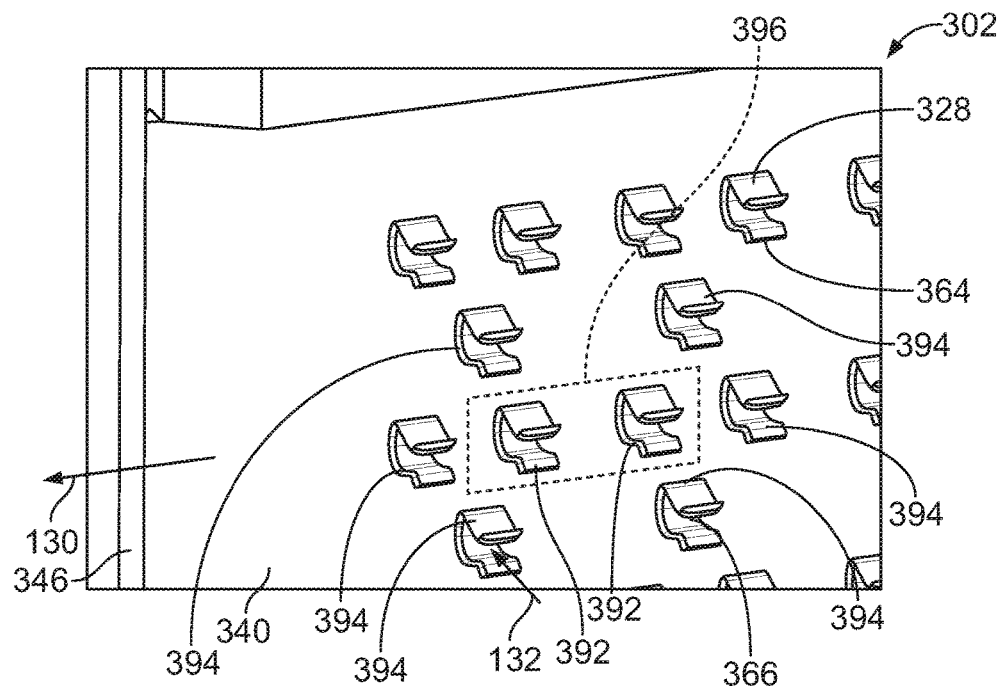
FIG. 14 is a perspective view of a portion of the second electrical connector in accordance with an exemplary embodiment.

FIG. 13 is a perspective view of a portion of the second circuit card assembly 122 in accordance with an exemplary embodiment. FIG. 14 is a perspective view of a portion of the second electrical connector 302 in accordance with an exemplary embodiment. In an exemplary embodiment, the electrical connector 302 includes a header housing 340 holding the contacts 328. The header housing 340 includes walls defining a cavity 341 configured to receive the mating housing 240 of the first electrical connector 202 (both shown in FIG. 8).

The header housing 340 includes a first side 342, a second side 344, a front 346 and a rear 348. The first side 342 defines the mating end 334 of the electrical connector 302. The mating end 334 is oriented parallel to the second PCB 300. In an exemplary embodiment, the header housing 340 holds the contacts 328 for mating with the first electrical connector 202. For example, each of the contacts 328 includes a mating end 364 (FIG. 14) exposed at or beyond the first side 342 for mating with the first electrical connector 202. The mating ends 364 are provided at the first side 342 in a predetermined layout for mating with the first electrical connector 202. The mating ends 364 have mating interfaces 366 for electrical connection with the first contacts 228.

The header housing 340 includes a top 350 and a bottom 352. In an exemplary embodiment, the top 350 and the bottom 352 include connecting elements 354 for connecting the second electrical connector 302 to the first electrical connector 202. In the illustrated embodiment, the connecting elements 354 include pockets 356 defined by ledges 355 at the top 350 and the bottom 352. The pockets 356 are configured to receive corresponding connecting elements 254 (shown in FIG. 8) of the receptacle housing 241 of the first electrical connector 202. The ledges 355 are configured to be received in corresponding grooves 256 (shown in FIG. 8). Other types of connecting elements 354 may be provided in alternative embodiments, such as pins, clips, fasteners, and the like. The header housing 340 includes actuators 357 at the first side 342 configured to actuate the drive members 258 (shown in FIG. 8).

The header housing 340 defines the mounting end 332 of the electrical connector 302 configured to be mounted to the PCB 300. Optionally, portions of the contacts 328 may extend beyond the mounting end 332 for termination to the PCB 300. For example, the contacts 328 may include terminating ends (not shown), such as compliant pins, solder tails, and the like, configured to be terminated to the PCB 300.

In an exemplary embodiment, the contacts 328 include signal contacts 392 and ground contacts 394. Optionally, the signal contacts 392 may be arranged in pairs 396 configured to convey differential signals (differential pairs of signal contacts); however, the signal contacts 392 may convey single-ended signals rather than differential signals. The ground contacts 394 are interspersed with the signal contacts 392 to provide electrical shielding for the signal contacts 392. For example, the ground contacts 394 may be provided between the pairs 396 of signal contacts 392.

FIG. 15 is a top view of a portion of the first electrical connector 202 in accordance with an exemplary embodiment. FIG. 15 shows part of the mating housing 240 and the inner dielectric bodies 410 as well as part of the receptacle housing 241 and the outer dielectric bodies 412 with the flexible conductors 404, 405 and the intermediate dielectric bodies 414, 416 therebetween. Only the signal contacts 292 are illustrated in FIG. 15. FIG. 15 illustrates the mating housing 240 in an extended position having moved from a retracted position represented by the line 420 to the position shown in FIG. 15 in the connector mating direction 132. The flexible conductors 404 are stretched when the mating housing 240 is moved. The flexible conductors 404 are shown in phantom in the unflexed position.

Optionally, the flexible conductors 404 of the signal contacts 292 are independently movable. For example, each of the flexible conductors 404 includes separate first and second intermediate dielectric bodies 414, 416, which may be moved independently of each other. For example, the first intermediate dielectric bodies 414 may abut against each other and slide relative to each other and the second intermediate dielectric bodies 416 may abut against each other and slide relative to each other.

The flexible conductors 404 include exposed portions 422 and embedded portions 424. The embedded portions 424 are embedded in the intermediate dielectric bodies 414, 416. The exposed portions 422 extend between the intermediate dielectric bodies 414 and 416, between the inner dielectric bodies 410 and the intermediate dielectric bodies 414, and between the outer dielectric bodies 412 and the intermediate dielectric bodies 416. In the illustrated embodiment, the embedded portions 422 include a first signal section 424a and a second signal section 424b; however, the flexible conductors 404 may include greater or fewer signal sections. The flexible conductors 404 may include greater or fewer exposed portions 422 and/or greater or fewer embedded portions 424. In an exemplary embodiment, the embedded portions 424 are rigid and do not flex when the flexible conductors 404 are moved. The exposed portions 422 are configured to bend and move when the flexible conductors 404 are moved. For example, each exposed portion 422 includes a bent portion 426 between other portions, such as the adjacent embedded portions 424. The bent portion 426 is bent at an angle or a curve. The angle of the bent portion 426 may change when the mating housing 240 is moved in the connector mating direction 132 to lengthen the flexible conductors 404. Optionally, different exposed portions 422 may have the bent portions 426 bent in different directions. Optionally, the bent portions 426 may include a single band or may include multiple bands. The bent portions 426 may be V-shaped, W shaped, Z-shaped, curvy, or may have another shape in various embodiments.

FIG. 16 is a top view of a portion of the first electrical connector 202 in accordance with an exemplary embodiment. FIG. 16 shows part of the mating housing 240 and the inner dielectric bodies 410 as well as part of the receptacle housing 241 and the outer dielectric bodies 412 with the flexible conductors 404 and the intermediate dielectric bodies 414, 416 therebetween. FIG. 16 illustrates the mating housing 240 in an extended and translated position having moved from the retracted position represented by the line 420 to the position shown in FIG. 16 in the connector mating direction 132 and in the board loading direction 130. For example, during assembly, the first electrical connector 202 and/or the second electrical connector 302 may be moved in the board loading direction 130 before, during, and/or after the mating housing 240 moving in the connector mating direction 132. For example, during mating of the first and second PCBs 200, 300 the PCBs 200 and/or 300 may have over travel when loading into the rack. The first electrical connector 202 accommodates the over travel conditioned by allowing the mating housing 240 to be translated in the board loading direction 130. The flexible conductors 404 accommodate the over travel by translating with the mating housing 240.

FIG. 17 is a top view of a portion of the first electrical connector 202 in accordance with an exemplary embodiment showing the signal contacts 292 and the ground contacts 294. FIG. 18 is a top view of a portion of the first electrical connector 202 in accordance with an exemplary embodiment showing the signal contacts 292 and the ground contacts 294 with the intermediate dielectric bodies 414, 416 removed to illustrate portions of the ground contacts 294. The ground contacts 294 flank both sides of the signal contacts 292. The ground contacts 294 provide electrical shielding for the signal contacts 292. The ground contacts 294 follow similar paths as the signal contacts 292 between the mating housing 240 and the inner dielectric bodies 410 and the receptacle housing 241 and the outer dielectric bodies 412.

The intermediate dielectric bodies 414, 416 provide electrical isolation between the signal contacts 292 and the ground contacts 294. The intermediate dielectric bodies 414, 416 may hold the ground contacts 294 spaced apart from the signal contacts 292. In an exemplary embodiment, the ground contacts 294 abut against the exterior sides of the intermediate dielectric bodies 414, 416 to position the ground contacts 294 relative to the signal contacts 292 passing through the interior of the intermediate dielectric bodies 414, 416.

In an exemplary embodiment, the flexible conductors 405 of the ground contacts 294 include corresponding bent portions 428. Between the bent portions 428, the flexible conductors 405 include primary beams 430 and secondary beams 432 extending generally perpendicular from the primary beams 430 to provide shielding on two sides of the corresponding signal contact 292. The primary beams 430 may be continuous with the bent portions 428. The secondary beams 432 extend from the tops of the primary beams 430 and are folded toward each other to extend over the tops of the signal conductors 292 in the area of the first and second signal sections 424a, 424b. When assembled, the secondary beams 432 extend into the intermediate dielectric bodies 414, 416. In an exemplary embodiment, the secondary beams 432 include connecting elements that electrically connect the two ground contacts 294. The connecting elements may be protrusions, tabs, spring beams or other elements to directly connect the ground contacts 294 to electrically common the ground contacts 294. In an exemplary embodiment, because the flexible conductors 404 of the ground contacts 294 are movable relative to each other, the connecting elements may slide or move along the other ground contact 294 and maintain an electrical connection therebetween.

In the illustrated embodiment, the ground contacts 294 provide shielding along the interior and the exterior of the bent portions 426 of the signal contacts 292 but do not provide shielding above the bent portions 426. In alternative embodiments, the ground contacts 294 may include extensions or covers for covering at least parts of the bent portions 426 to enhance electrical shielding through the bend. For example, FIG. 19 illustrates the ground contacts 294 with covers for the bent portions 426 in accordance with an exemplary embodiment.

Figure 19:
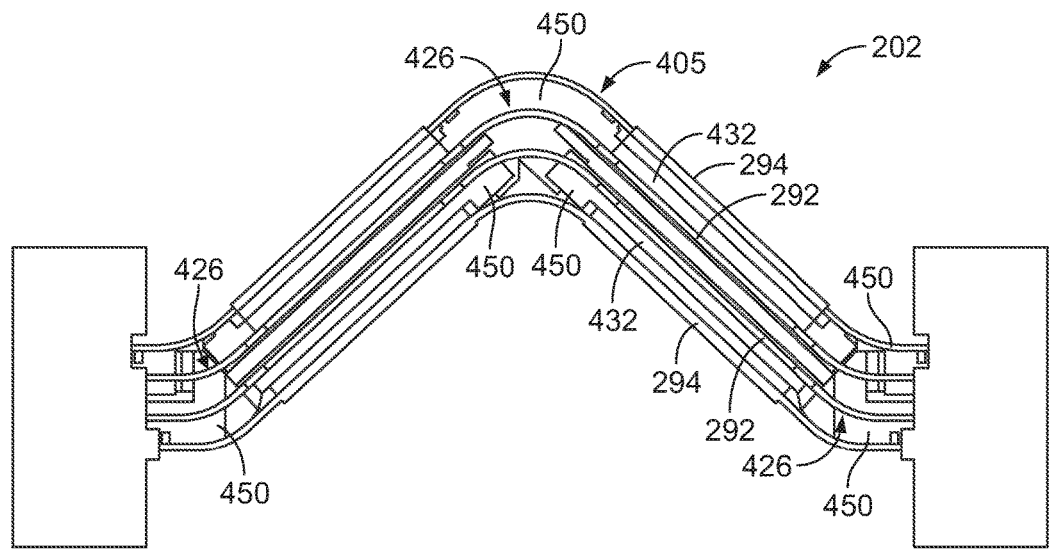
FIG. 19 is a bottom view of a portion of the first electrical connector in accordance with an exemplary embodiment showing the signal contacts and the ground contacts in accordance with an exemplary embodiment.

FIG. 19 is a bottom view of a portion of the first electrical connector 202 in accordance with an exemplary embodiment showing the signal contacts 292 and the ground contacts 294. The ground contacts 294 include covers 450 at the bends to at least partially cover the bent sections 426 of the signal contacts 292. The covers 450 provide additional shielding over the tops of the bent sections 426 between the secondary beams 432. In an exemplary embodiment, the covers 450 are extensions of the secondary beams 432. In an exemplary embodiment, the covers 450 from different ground contacts 294 directly engage each other at one or more points of contact to electrically common the covers 450. In an exemplary embodiment, the covers 450 non-permanently engage each other to allow relative movement between the covers 450 as the flexible conductors 405 are flexed. For example, the covers 450 slidably engage each other.

Figure 20:
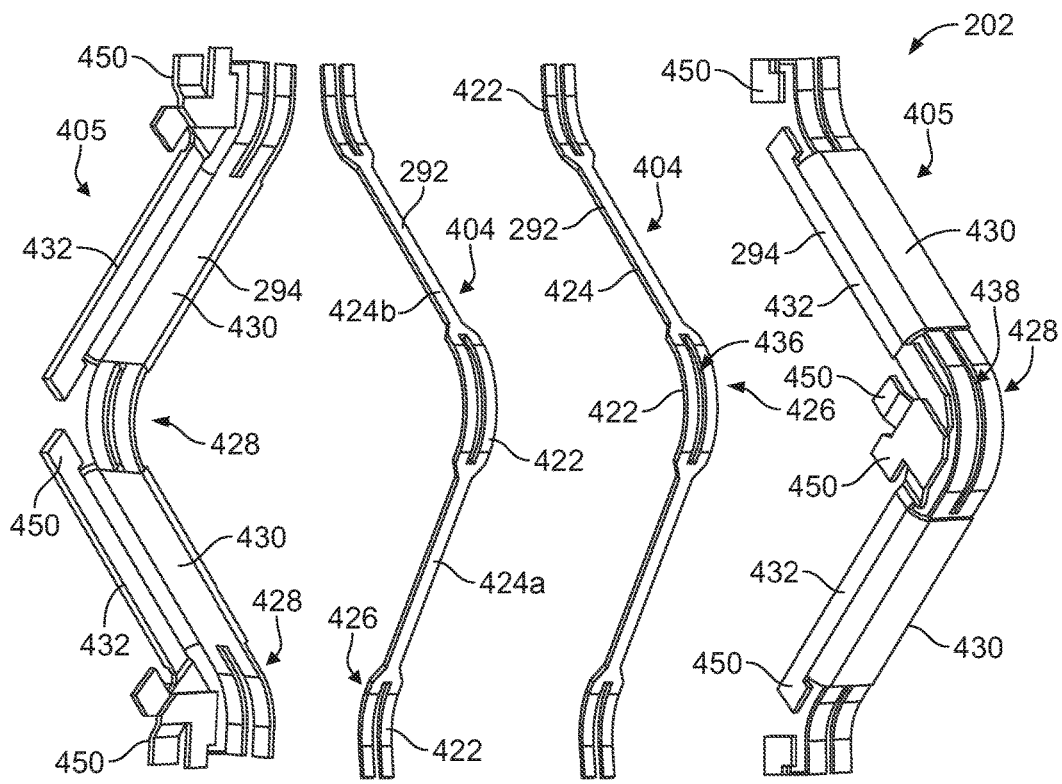
FIG. 20 is an exploded view of a portion of the first electrical connector showing portions of the flexible conductors in accordance with an exemplary embodiment.

FIG. 20 is an exploded view of a portion of the first electrical connector 202 showing portions of the flexible conductors 404 of a pair of signal contacts 292 and the flexible conductors 405 of corresponding ground contacts 294. One of the ground contacts 294 on the left side of FIG. 20 is rotated 180° to illustrate the opposite side of such ground contact 294. The signal contacts 292 are illustrated without the intermediate dielectric bodies 414, 416 to illustrate the embedded portions 424 of the flexible conductors 404 defining the first and second signal sections 424a, 424b on opposite sides of the bent portions 426. The bent portions 426 of the signal contacts 292 extend from the embedded portions 424. The primary and secondary beams 430, 432 of the ground contacts 294 are illustrated. The bent portions 428 of the ground contacts 294 are shown extending from the primary beams 430 of the ground contacts 294. The covers 450 of the ground contacts 294 are shown extending form the secondary beams 432.

In an exemplary embodiment, the exposed portions 422 of the flexible conductors 404 of the signal contacts 292 are wider than the embedded portions 424 for impedance control along the signal path. For example, because the exposed portions 422 are exposed to air and are not surrounded by the plastic material of the intermediate dielectric bodies 414, 416, the impedance through the exposed portions 422 may be higher. The exposed portions 422 are widened to lower the impedance along the exposed portions 422. In an exemplary embodiment, the exposed portions 422 include slots 436 to lower the bending force needed to bend or manipulate the flexible conductors 404. The slots 436 make the bent portions 426 more flexible. In an exemplary embodiment, the ground contacts 294 are as wide as or wider than the signal contacts 292 to provide electrical shielding for the signal contacts 292. For example, the ground contacts 294 may have a similar width as the exposed portions 422. The ground contacts 294 include slots 438 in the bent portions 428 to make the ground contacts 294 flexible.

Figure 21:
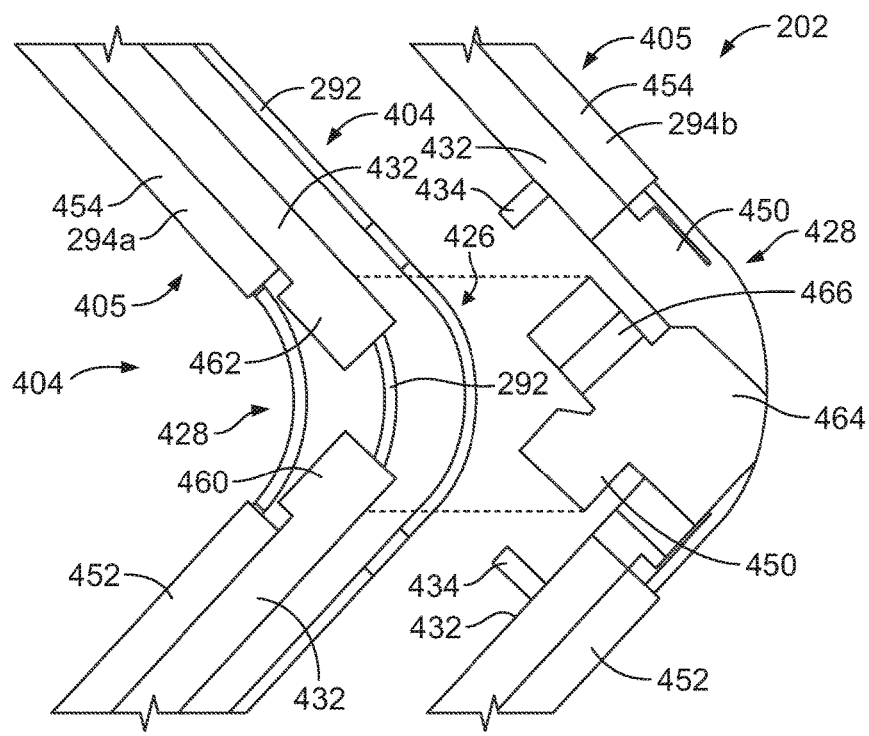
FIG. 21 is an exploded view of a portion of the first electrical connector showing portions of the flexible conductors in accordance with an exemplary embodiment.
Figures 22, 23:
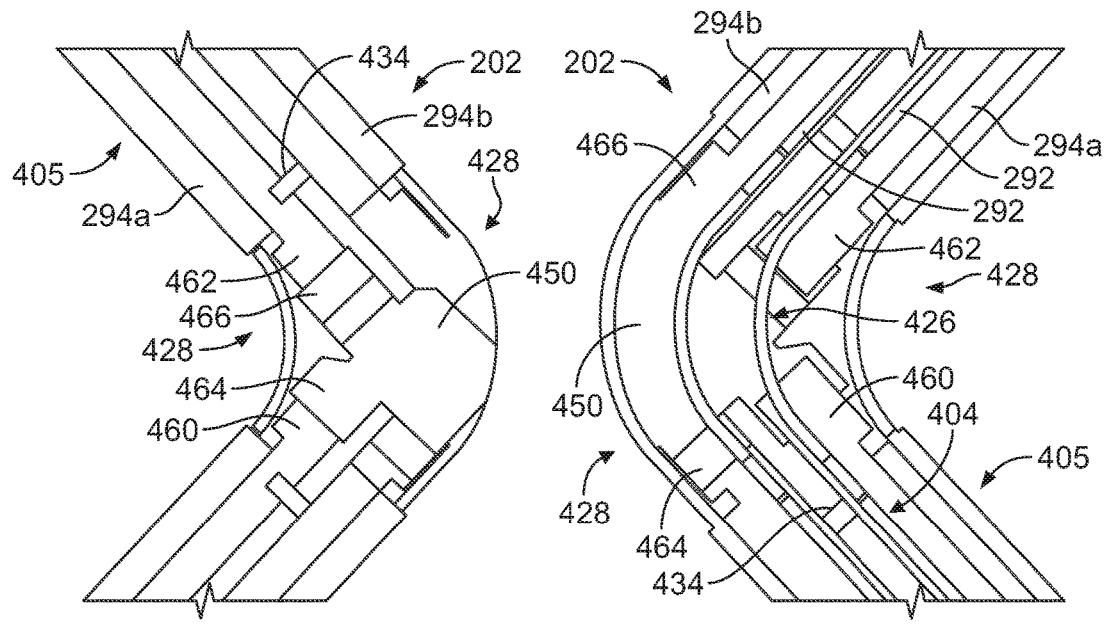
FIG. 22 is a top view of a portion of the first electrical connector showing portions of the flexible conductors in accordance with an exemplary embodiment.
FIG. 23 is a bottom view of a portion of the first electrical connector showing portions of the flexible conductors in accordance with an exemplary embodiment.

FIG. 21 is an exploded view of a portion of the first electrical connector 202 showing portions of the flexible conductors 404 of a pair of signal contacts 292 and portions of the flexible conductors 405 of a corresponding pair of ground contacts 294. FIG. 21 shows an interior ground contact 294a positioned relative to the signal contacts 292 and an exterior ground contact 294b exploded and shifted to the right to illustrate the signal contacts 292. FIG. 22 is a top view of a portion of the first electrical connector 202 showing portions of the flexible conductors 404 of a pair of signal contacts 292 and portions of the flexible conductors 405 of a corresponding pair of ground contacts 294. FIG. 23 is a bottom view of a portion of the first electrical connector 202 showing portions of the flexible conductors 404 of a pair of signal contacts 292 and portions of the flexible conductors 405 of a corresponding pair of ground contacts 294.

The ground contacts 294 flank the pair of signal contacts 292. The interior ground contact 294a extends along the interior of the bend in the signal contacts 292 while the exterior ground contact 294b extends along the exterior of the bend in the signal contacts 292. The bent portion 428 of the interior ground contact 294a is interior of the bent portions 426 of the signal contacts 292. The bent portion 428 of the exterior ground contact 294b is exterior of the bent portions 426 of the signal contacts 292.

The covers 450 are configured to cover various parts of the bent portions 426 of the signal contacts 292. Optionally, the covers 450 may cooperate to entirely cover the signal contacts 292 from above. In the illustrated embodiment, each ground contact 294 includes a first ground section 452 and a second ground section 454. The bent portions 428 extend between the first and second ground sections 452, 454. In the illustrated embodiment, the first ground section 452 of the interior ground contact 294 includes a first cover 460; the second ground section 454 of the interior ground contact 294a includes a second cover 462; the first ground section 452 of the exterior ground contact 294b includes a third cover 464; and the second ground section 454 of the exterior ground contact 294b includes a fourth cover 466. The first and second covers 460, 462 cover portions of the first or interior signal contact 292. The third and fourth covers 464, 466 cover portions of the second or exterior signal contact 292. Optionally, the third and fourth covers 464, 466 may cover portions of the interior signal contact 292 and/or the first and second covers 460, 462 may cover portions of the exterior signal contact 292.

In an exemplary embodiment, the third cover 464 directly engages and is electrically connected to the fourth cover 466 and the second cover 462 and the fourth cover 466 directly engages and is electrically connected to the first cover 460. Other arrangements are possible in alternative embodiments. In an exemplary embodiments, the contact points between the various covers 450 are non-permanent allowing relative movement between the covers 450 during lengthening and shortening of the flexible conductors 405. For example, the points of contact may be configured to slide along the covers 450.

The secondary beams 432 span across the tops of portions of the signal contacts 292. The secondary beams 432 provide electrical shielding for the pair of signal contacts 292 from another pair of signal contacts 292 that is located above the illustrated pair of signal contacts 292. Connecting elements 434 electrically connect the opposing secondary beams 432.

Optionally, the connecting elements 434 may slide along the other secondary beam 432 when the flexible conductors 405 are flexed.

Figure 24:
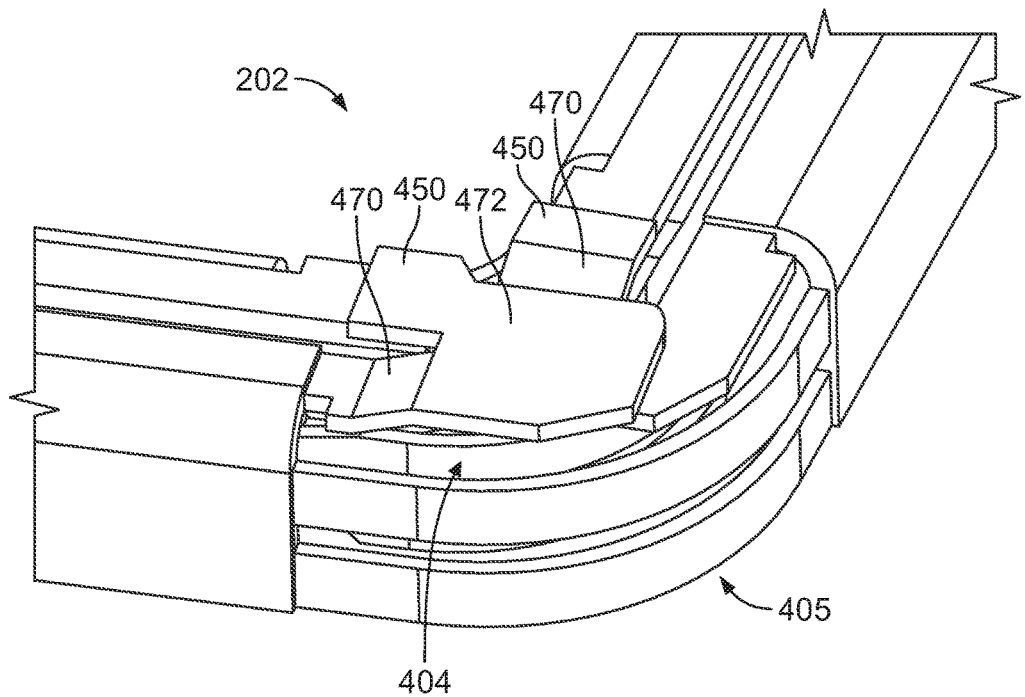
FIG. 24 is a perspective view of a portion of the first electrical connector showing portions of the flexible conductors in accordance with an exemplary embodiment.
Figure 25:
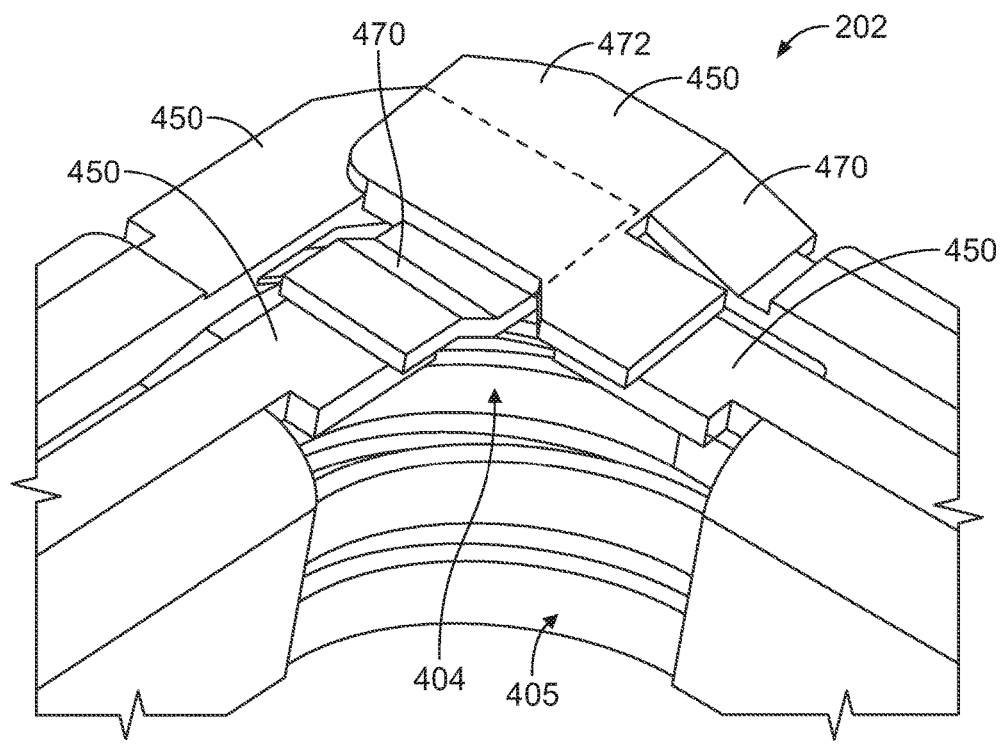
FIG. 25 is a perspective view of a portion of the first electrical connector showing portions of the flexible conductors in accordance with an exemplary embodiment.

FIG. 24 is a perspective view of a portion of the first electrical connector 202 showing portions of the flexible conductors 404, 405. FIG. 25 is a perspective view of a portion of the first electrical connector 202 showing portions of the flexible conductors 404, 405. In an exemplary embodiment, the covers 450 are overlapping. For example, portions of the covers 450 may be non-coplanar to overlap and/or undercut other portions of other covers 450. The covers 450 include ramps 470 to raise or lower pads 472 to a different plane to allow some portions of the covers 450 to overlap or be overlapped. Optionally, overlapping portions may be used to force or press the overlapped portions downward, such as into engagement with other covers 450. Alternatively, undercutting portions may be used to force or press the undercut portions upward, such as into engagement with other covers 450.

Figure 26:
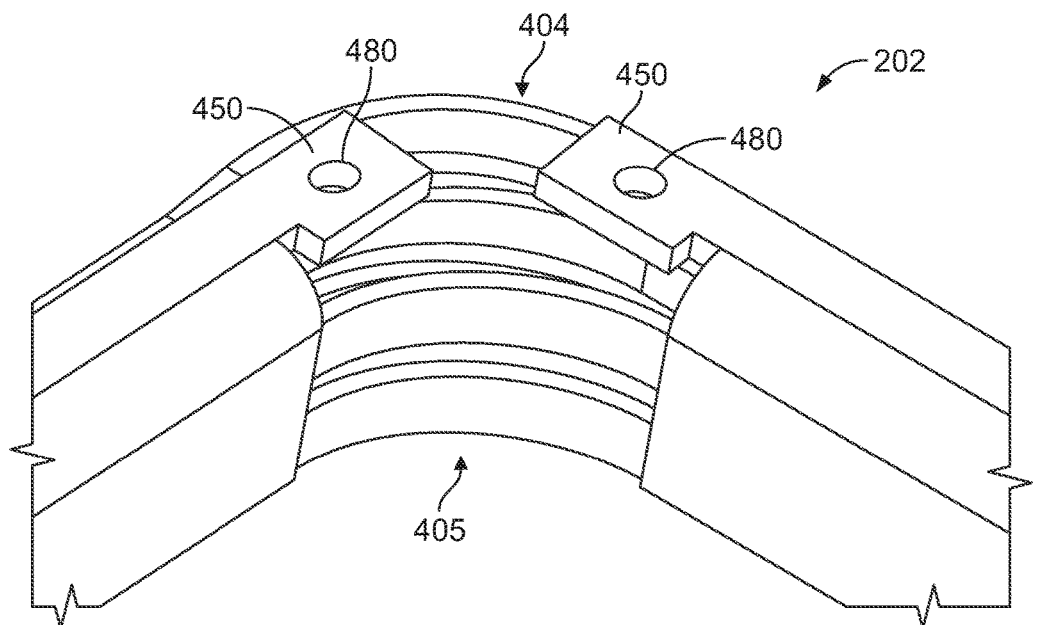
FIG. 26 is a perspective view of a portion of the first electrical connector showing portions of the flexible conductors in accordance with an exemplary embodiment.
Figure 27:
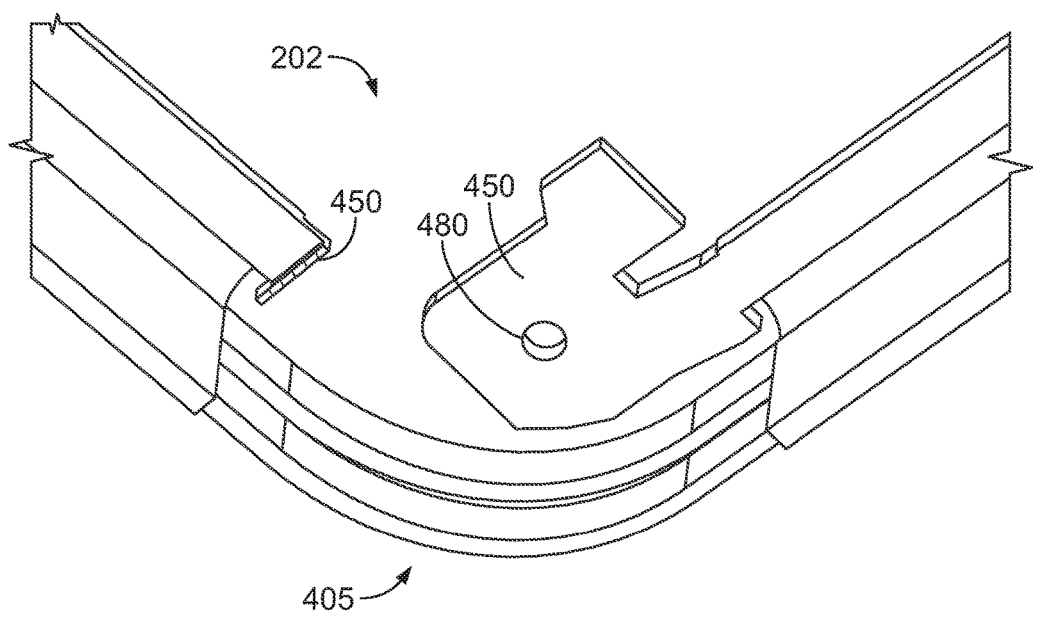
FIG. 27 is a perspective view of a portion of the first electrical connector showing a portion of the flexible conductor in accordance with an exemplary embodiment.

FIG. 26 is a perspective view of a portion of the first electrical connector 202 showing portions of the flexible conductors 404, 405. FIG. 27 is a perspective, partial sectional view of a portion of the first electrical connector 202 showing a portion of the flexible conductor 405. In an exemplary embodiment, at least one of the covers 450 includes protrusions 480 extending therefrom. The protrusions 480 may define points of contact with other covers 450. For example, the protrusions 480 may be dimples formed in the covers 450 having a single point of contact at the tip of the dimple. The protrusions 480 may extend upward or downward to engage corresponding covers 450 located above or below the protrusion 480. The protrusions 480 may have other shapes in alternative embodiments, such as ridges, beams or other shapes.

Figures 28, 29:
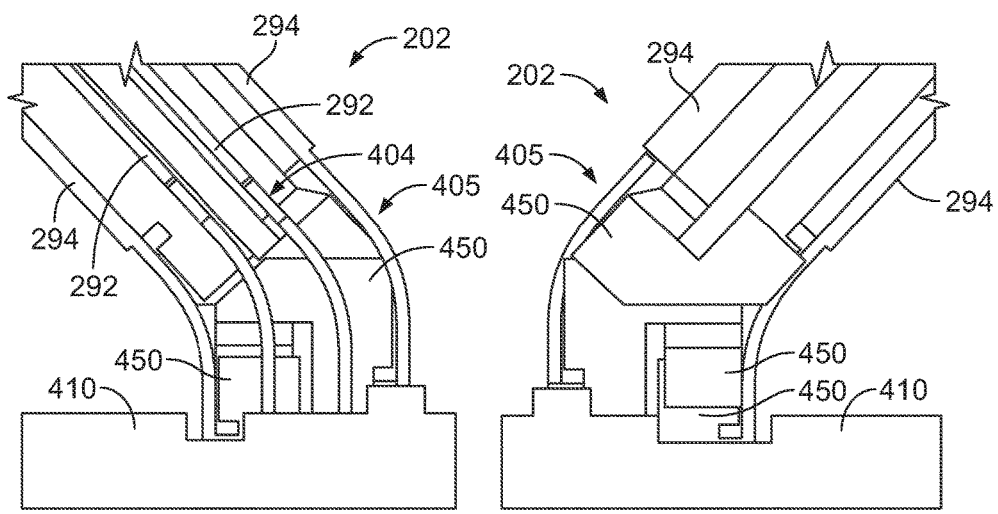
FIG. 28 is a bottom view of a portion of the first electrical connector showing portions of the flexible conductors in accordance with an exemplary embodiment.
FIG. 29 is a top view of a portion of the first electrical connector showing portions of the flexible conductors in accordance with an exemplary embodiment.
Figure 30:
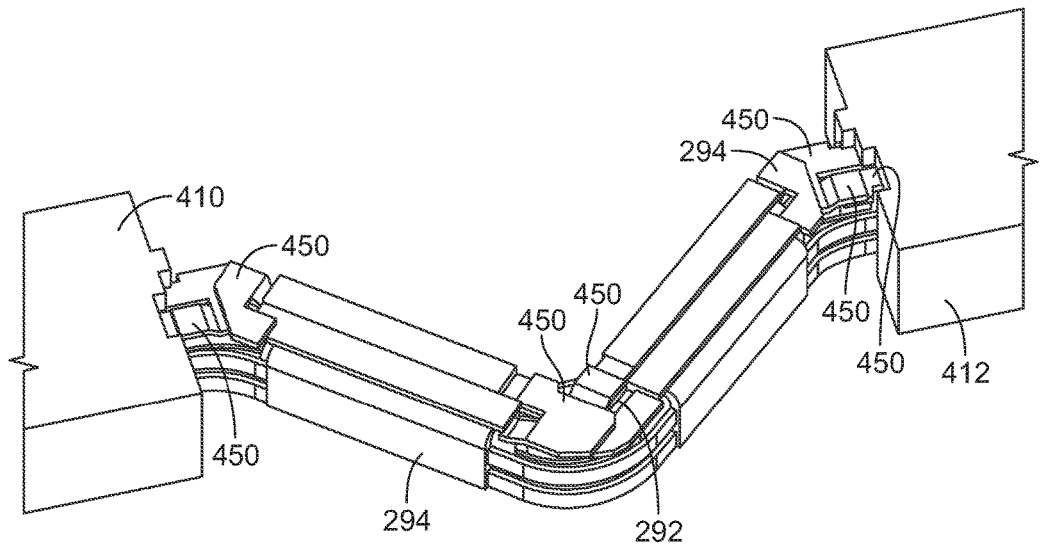
FIG. 30 is a perspective view of a portion of the first electrical connector showing the flexible conductors in accordance with an exemplary embodiment.

FIG. 28 is a bottom view of a portion of the first electrical connector 202 showing portions of the flexible conductors 404, 405 at the inner dielectric body 410. FIG. 29 is a top view of a portion of the first electrical connector 202 showing portions of the flexible conductors 405 at the inner dielectric body 410. FIG. 30 is a perspective view of a portion of the first electrical connector 202 showing the flexible conductors 404, 405 at the inner and outer dielectric bodies 410, 412. In an exemplary embodiment, the ground contacts 294 include covers 450 at the bends immediately adjacent the inner dielectric body 410 (FIG. 28) and the outer dielectric bodies 412 (FIG. 30). The covers 450 extend from both ground contacts 294. The covers 450 may overlap and directly engage each other to provide electrical shielding above both signal contacts 292.

Figure 31:
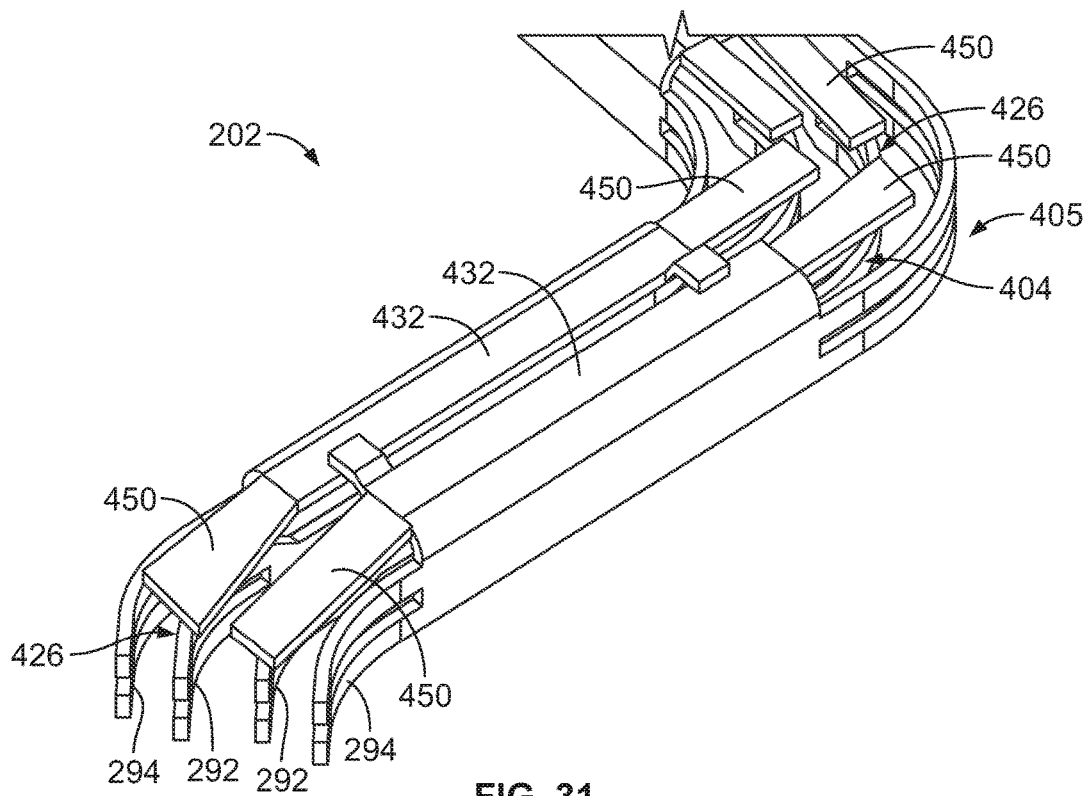
FIG. 31 is a perspective view of a portion of the first electrical connector showing portions of the flexible conductors in accordance with an exemplary embodiment.

FIG. 31 is a perspective view of a portion of the first electrical connector 202 showing portions of the flexible conductors 404, 405 in accordance with an exemplary embodiment. The flexible conductors 405 include the covers 450 covering portions of the signal contacts 292 through the bend. The covers 450 are non-continuous through the bend. In the illustrated embodiment, the covers 450 are cantilevered outward from the secondary beams 432 to cover at least a majority of the bent portions 426 of the signal contacts 292. In the illustrated embodiment, the covers 450 do not overlap but the distal ends are positioned close to each other to provide electrical shielding for the majority of the bent portions 426. The covers 450 are positioned and shaped to not interfere or bind against each other when the flexible conductors 405 are flexed during mating with the second electrical connector 302.

Figure 32:
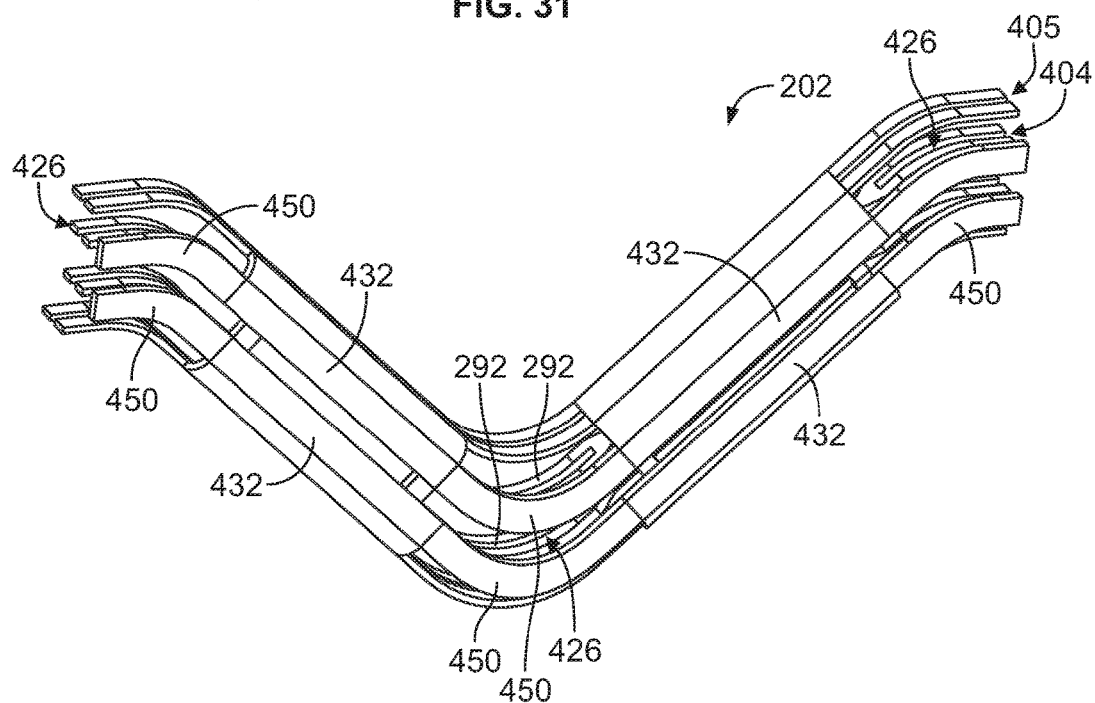
FIG. 32 is a perspective view of a portion of the first electrical connector showing portions of the flexible conductors in accordance with an exemplary embodiment.

FIG. 32 is a perspective view of a portion of the first electrical connector 202 showing portions of the flexible conductors 404, 405 in accordance with an exemplary embodiment. The flexible conductors 405 include the covers 450 covering the signal contacts 292 through the bend. The covers 450 are continuous through the bend. In the illustrated embodiment, the covers 450 are integral with and continuous between the secondary beams 432 to cover the bent portions 426 of the signal contacts 292. The covers 450 are curved to generally follow the curvature of the signal contacts 292 through the bend. While the covers 450 are less flexible than embodiments having discrete, overlapping pieces, the covers 450 may be made narrow enough to have some flexibility when the flexible conductors 405 are flexed during mating with the second electrical connector 302. The covers 450 may include slots or other features to make the covers 450 more flexible to allow flexing or bending during mating.

Figure 33:
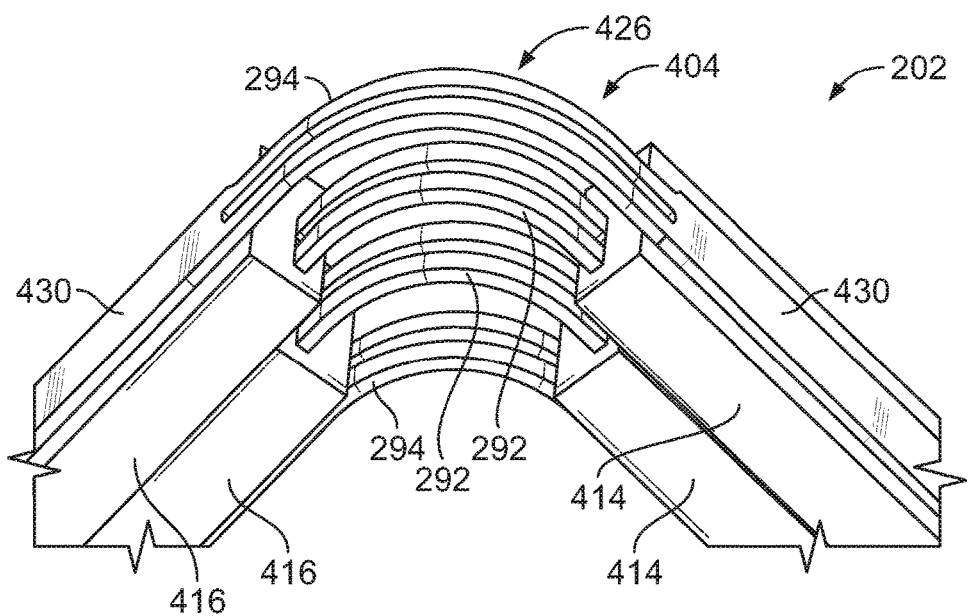
FIG. 33 is a bottom perspective view of a portion of the first electrical connector showing portions of the flexible conductors in accordance with an exemplary embodiment.

FIG. 33 is a bottom perspective view of a portion of the first electrical connector 202 showing portions of the flexible conductors 404 of the pair of signal contacts 292 and corresponding ground contacts 294. The first and second intermediate dielectric bodies 414, 416 are illustrated in FIG. 33. The primary beams 430 extend along sides of the intermediate dielectric bodies 414, 416. The bent portions 426 are provided at locations between the intermediate dielectric bodies 414, 416.

Figure 34:
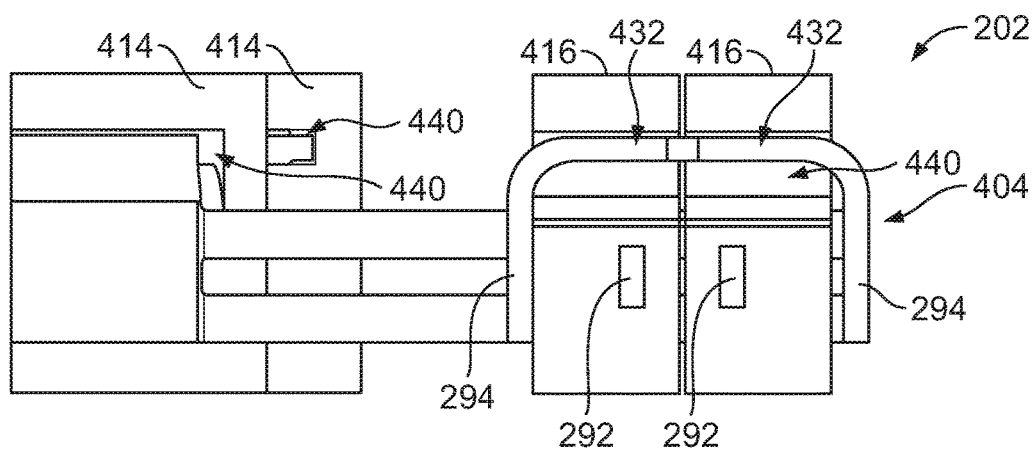
FIG. 34 is a partial sectional view of a portion of the first electrical connector showing portions of the flexible conductors in accordance with an exemplary embodiment.

FIG. 34 is a partial sectional view of a portion of the first electrical connector 202 showing portions of the flexible conductors 404 of the pair of signal contacts 292 and corresponding ground contacts 294. The first and second intermediate dielectric bodies 414, 416 include slots 440 therein that receive the secondary beams 432. Optionally, the slots 440 are open entirely through the intermediate dielectric bodies 414, 416 to allow the ground contacts 294 to engage and electrically connected to each other. The secondary beams 432 provide electrical shielding above the signal contacts 292.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

What is claimed is:

1. An electrical connector for a circuit card assembly including a printed circuit board (PCB), the electrical connector comprising:
   a mating housing having a mating end configured to be mated with a second electrical connector of a second circuit card assembly, the mating housing being movable relative to the PCB between a resting position and an extended position for mating with the second electrical connector; and
   contact modules coupled to the mating housing, the contact modules including signal contacts having a mating conductor, a mounting conductor and a flexible conductor between the mating conductor and the mounting conductor, the mounting conductor being terminated to the PCB, the mating conductor being held by and movable with the mating housing relative to the mounting conductor and the PCB, the flexible conductor being flexible to allow relative movement of the mating conductor relative to the mounting conductor, the flexible conductor having a bent portion changing shape when the flexible conductor is flexed, the contact modules including ground contacts extending along corresponding signal contacts and providing electrical shielding for the signal contacts, the ground contacts including flexible conductors following corresponding flexible conductors of the signal contacts, the flexible conductors of the ground contacts having covers extending along and providing shielding along the bent portion of the corresponding signal contact.

2. The electrical connector of claim 1, wherein portions of the ground contacts are non-continuous through the covers.

3. The electrical connector of claim 1, wherein the ground contacts include overlapping sections in the covers.

4. The electrical connector of claim 1, wherein the flexible conductors are arranged in pairs, the ground contacts are arranged in pairs for providing electrical shielding for the corresponding pairs of flexible conductors.

5. The electrical connector of claim 1, wherein the flexible conductor of the signal contact includes a first signal section and a second signal section with the bent portion between the first signal section and the second signal section, the ground contact includes a first ground section and a second ground section with the cover between the first ground section and the second ground section, the cover comprising a first extension extending from the first ground section and a second extension extending from the second ground section, the first extension being independently movable with respect to the second extension.

6. The electrical connector of claim 5, wherein the first extension at least partially overlaps the second extension.

7. The electrical connector of claim 5, wherein at least one of the first extension and the second extension includes a connecting protrusion configured to engage and electrically connect to the other of the first extension or the second extension.

8. The electrical connector of claim 5, wherein the first extension is slidably coupled to the second extension.

9. The electrical connector of claim 5, wherein the flexible conductors of the signal contacts are arranged in pairs, at least one of the first extension and the second extension overlapping the bent portions of the flexible conductors of the corresponding pair of signal contacts.

10. The electrical connector of claim 1, wherein the ground contacts include inner ground contacts and outer ground contacts arranged in pairs to surround corresponding signal contacts, the inner ground contact having an inner wall extending interior of the flexible conductor of the corresponding signal contact through the cover and an upper wall covering portions of the bent portion of the corresponding signal contact from above, the outer ground contact having an outer wall extending exterior of the flexible contact of the corresponding signal contact through the cover and an upper wall covering portions of the bent portion of the corresponding signal contact from above, the upper wall of the inner ground contact engaging and being electrically connected to the upper wall of the corresponding outer ground contact.

11. The electrical connector of claim 10, wherein a portion of the upper wall of the outer ground contact overlaps a portion of the upper wall of the corresponding inner ground contact.

12. The electrical connector of claim 1, wherein the flexible conductors are extended during mating with the second electrical connector in a connector mating direction.

13. The electrical connector of claim 1, wherein an angle of the bent portion changes when the mating housing is moved in the connector mating direction to lengthen the flexible conductors.

14. The electrical connector of claim 1, wherein the contact module includes an intermediate dielectric body covering a portion of the signal contact, the intermediate dielectric body separating the signal contact from the ground contact.

15. An electrical connector for a circuit card assembly including a printed circuit board (PCB), the electrical connector comprising:
   a receptacle housing having a first side and a second side including a cavity between the first and second sides, the receptacle housing configured to be mounted to a mounting area of the PCB;
   a mating housing received in the cavity of the receptacle housing, the mating housing being movable relative to the receptacle housing in a connector mating direction, the mating housing having a mating end configured to be mated with a second electrical connector of a second circuit card assembly; and
   contact modules coupled to the receptacle housing and the mating housing, the contact modules each including a leadframe having signal contacts including a mating conductor, a mounting conductor and a flexible conductor between the mating conductor and the mounting conductor, the contact module including an inner dielectric body holding the mating conductors in the mating housing, the contact module including an outer dielectric body separate and discrete from the inner dielectric body holding the mounting conductors in the receptacle housing, the flexible conductors extending between the inner dielectric body and the outer dielectric body and being flexible therebetween to allow relative movement of the inner dielectric body and the mating housing in the connector mating direction relative to the outer dielectric body and the receptacle housing, the flexible conductor having a bent portion changing shape when the flexible conductor is flexed, the contact modules including ground contacts extending along corresponding signal contacts and providing electrical shielding for the signal contacts, the ground contacts including flexible conductors following corresponding flexible conductors of the signal contacts, the flexible conductors of the ground contacts having covers extending along and providing shielding along at least one side of the bent portion of the corresponding signal contact.

16. The electrical connector of claim 15, wherein the ground contacts include overlapping sections in the covers.

17. The electrical connector of claim 15, wherein the flexible conductor of the signal contact includes a first signal section and a second signal section with the bent portion between the first signal section and the second signal section, the ground contact includes a first ground section and a second ground section with the cover between the first ground section and the second ground section, the cover comprising a first extension extending from the first ground section and a second extension extending from the second ground section, the first extension being independently movable with respect to the second extension.

18. The electrical connector of claim 15, wherein the ground contacts include inner ground contacts and outer ground contacts arranged in pairs to surround corresponding signal contacts, the inner ground contact having an inner wall extending interior of the flexible conductor of the corresponding signal contact through the cover and an upper wall covering portions of the bent portion of the corresponding signal contact from above, the outer ground contact having an outer wall extending exterior of the flexible contact of the corresponding signal contact through the cover and an upper wall covering portions of the bent portion of the corresponding signal contact from above, the upper wall of the inner ground contact engaging and being electrically connected to the upper wall of the corresponding outer ground contact.

19. The electrical connector of claim 15, wherein the contact module has a gap between the inner dielectric body and the outer dielectric body, the flexible conductors spanning the gap, the gap being widened when the mating housing is moved in the connector mating direction, the flexible conductors flexing in the gap when the gap is widened.

20. A communication system comprising:
a first circuit card assembly having a first printed circuit board (PCB) and a first electrical connector mounted to the first PCB, the first electrical connector having a first mating end and first contacts at the first mating end, the first contacts having a mating conductor, a mounting conductor and a flexible conductor between the mating conductor and the mounting conductor, the mounting conductor being terminated to the first PCB, the flexible conductor allowing the mating conductor to move in a connector mating direction along a connector mating axis relative to the mounting conductor, the flexible conductor having a bent portion changing shape when the flexible conductor is flexed, the first electrical connector having a ground shield including ground contacts extending along corresponding first contacts and providing electrical shielding for the first contacts, the ground contacts including covers extending along and providing shielding along at least one side of the bent portion of the corresponding first contact; and
a second circuit card assembly having a second PCB and a second electrical connector mounted to the second PCB, the second electrical connector having a second mating end and second contacts at the second mating end mated with mating conductors of corresponding first contacts, the second electrical connector having a header housing holding the second contacts;
wherein at least one of the first PCB and the second PCB includes a slot receiving the other of the first PCB and the second PCB in a board loading direction along a board loading axis;
wherein the mating conductors are coupled to corresponding second contacts in the connector mating direction generally perpendicular to the board loading direction.

* * * * *